(12) United States Patent
Miyauchi et al.

(10) Patent No.: US 8,225,489 B2
(45) Date of Patent: Jul. 24, 2012

(54) METHOD OF MANUFACTURING MAGNETORESISTIVE ELEMENT HAVING A PAIR OF FREE LAYERS

(75) Inventors: Daisuke Miyauchi, Tokyo (JP); Takahiko Machita, Tokyo (JP); Keita Kawamori, Tokyo (JP)

(73) Assignee: TDK Corporation, Tokyo (JP)

( * ) Notice: Subject to any disclaimer, the term of this patent is extended or adjusted under 35 U.S.C. 154(b) by 258 days.

(21) Appl. No.: 12/732,795

(22) Filed: Mar. 26, 2010

(65) Prior Publication Data

US 2011/0232079 A1     Sep. 29, 2011

(51) Int. Cl.
*G11B 5/127* (2006.01)
*H04R 31/00* (2006.01)

(52) U.S. Cl. .............. 29/603.16; 29/603.13; 29/603.14; 29/603.15; 29/603.18; 216/62; 216/65; 216/66; 360/324.1; 360/324.11; 360/324.12; 360/324.2; 427/127; 427/128

(58) Field of Classification Search .. 29/603.13–603.16, 29/603.18; 360/324.1, 324.11, 324.12, 324.2; 427/127–131; 216/62, 65, 66
See application file for complete search history.

(56) References Cited

U.S. PATENT DOCUMENTS

| | | | |
|---|---|---|---|
| 6,669,983 B2 | 12/2003 | Kagami et al. | |
| 7,589,939 B2 * | 9/2009 | Wakui et al. | 360/324.1 |
| 7,842,334 B2 * | 11/2010 | Wakui et al. | 427/130 |
| 2009/0034133 A1 | 2/2009 | Miyauchi et al. | |

FOREIGN PATENT DOCUMENTS

| | | |
|---|---|---|
| JP | A-06-029647 | 2/1994 |
| JP | A-2007-234646 | 9/2007 |

* cited by examiner

*Primary Examiner* — Paul D Kim
(74) *Attorney, Agent, or Firm* — Oliff & Berridge, PLC

(57) ABSTRACT

An MR element includes a first exchange coupling shield layer, an MR stack, and a second exchange coupling shield layer that are arranged in this order from the bottom, and a nonmagnetic layer surrounding the MR stack. The MR stack includes a first free layer, a spacer layer, a second free layer, and a magnetic cap layer that are arranged in this order from the bottom. In the step of forming the MR stack and the nonmagnetic layer, a protection layer is formed on a layered film that will be the MR stack later, and a mask is then formed on the protection layer. Next, the layered film and the protection layer are etched using the mask and then the nonmagnetic layer is formed. After removal of the mask, the protection layer is removed by wet etching.

8 Claims, 14 Drawing Sheets

METHOD OF MANUFACTURING MAGNETORESISTIVE ELEMENT HAVING A PAIR OF FREE LAYERS

BACKGROUND OF THE INVENTION

1. Field of the Invention

The present invention relates to a method of manufacturing a magnetoresistive element that is for use in, for example, a thin-film magnetic head, and has a pair of free layers coupled to a pair of shields.

2. Description of the Related Art

Recently, magnetic disk drives have been improved in areal recording density, and thin-film magnetic heads of improved performance have been demanded accordingly. Among the thin-film magnetic heads, a composite thin-film magnetic head has been used widely. The composite thin-film magnetic head has a structure in which a read head including a magnetoresistive element (hereinafter, also referred to as MR element) for reading and a write head including an induction-type electromagnetic transducer for writing are stacked on a substrate.

Examples of MR elements include a giant magnetoresistive (GMR) element utilizing a giant magnetoresistive effect and a tunneling magnetoresistive (TMR) element utilizing a tunneling magnetoresistive effect.

Read heads are required to have characteristics of high sensitivity and high output. As the read heads that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer opposite from the spacer layer. The free layer is a ferromagnetic layer whose direction of magnetization changes in response to a signal magnetic field. The pinned layer is a ferromagnetic layer whose direction of magnetization is pinned. The antiferromagnetic layer is a layer that pins the direction of magnetization of the pinned layer by means of exchange coupling with the pinned layer. For spin-valve GMR elements, the spacer layer is a nonmagnetic conductive layer. For TMR elements, the spacer layer is a tunnel barrier layer.

Examples of the read head incorporating a GMR element include one having a current-in-plane (CIP) structure in which a current used for detecting a signal magnetic field (hereinafter referred to as a sense current) is fed in the direction parallel to the planes of the layers constituting the GMR element, and one having a current-perpendicular-to-plane (CPP) structure in which the sense current is fed in a direction intersecting the planes of the layers constituting the GMR element, such as the direction perpendicular to the planes of the layers constituting the GMR element.

The read head has a pair of shields with the MR element therebetween. The distance between the pair of shields is called a read gap length. Recently, with an increase in recording density, there have been increasing demands for a reduction in track width and a reduction in read gap length in read heads.

As one of MR elements that can achieve a reduction in read gap length, there has been proposed an MR element that includes a pair of ferromagnetic layers each functioning as a free layer, and a spacer layer disposed between the pair of ferromagnetic layers (such an MR element is hereinafter referred to as an MR element of three-layer structure), as disclosed in U.S. Patent Application Publication No. 2009/0034133 A1, for example. In the MR element of three-layer structure, when the pair of ferromagnetic layers are subjected to no external magnetic field, they are magnetized in directions that are antiparallel to each other and parallel to the track width direction. The directions of magnetization of the pair of ferromagnetic layers change in response to an external magnetic field.

In the read head incorporating the MR element of three-layer structure, a bias magnetic field is applied to the pair of ferromagnetic layers. The bias magnetic field changes the directions of magnetization of the pair of ferromagnetic layers so that their directions of magnetization each form an angle of approximately 45 degrees with respect to the track width direction. This makes the relative angle between the directions of magnetization of the pair of ferromagnetic layers approximately 90 degrees. When a signal magnetic field sent from the recording medium is applied to the read head, the relative angle between the directions of magnetization of the pair of ferromagnetic layers changes, and consequently, the MR element changes in resistance. With such a read head, it is possible to detect the signal magnetic field by detecting the resistance of the MR element. The read head incorporating the MR element of three-layer structure allows a much greater reduction in read gap length as compared with a read head incorporating a conventional GMR element.

For the MR element of three-layer structure, one of methods for making the directions of magnetization of the pair of ferromagnetic layers antiparallel to each other when no external magnetic field is applied is to establish antiferromagnetic coupling between the pair of ferromagnetic layers via the spacer layer by the RKKY interaction.

Disadvantageously, however, this method imposes limitation on the material and thickness of the spacer layer so as to allow antiferromagnetic coupling between the pair of ferromagnetic layers. In addition, since this method limits the material of the spacer layer to nonmagnetic conductive materials, it is applicable to neither a TMR element which is expected to provide a high output, nor a GMR element of CPP structure of current-confined-path type which is an MR element that is also expected to provide a high output and whose spacer layer includes a portion that allows the passage of currents and a portion that intercepts the passage of currents. The foregoing method further has the disadvantage that, even if it could be possible to make the directions of magnetization of the pair of ferromagnetic layers antiparallel to each other, it is difficult to make them parallel to the track width direction with reliability.

The inventors of this application then conceived providing a pair of shields with an MR stack interposed therebetween, the MR stack including a pair of free layers and a spacer layer interposed between the pair of free layers, so that the directions of magnetization of the pair of free layers in the MR stack are controlled by the pair of shields. According to this technique, the pair of free layers in the MR stack are magnetically coupled to the pair of shields, and are controlled so that their directions of magnetization are antiparallel to each other. Hereinafter, an MR element that is configured to include the foregoing MR stack and the pair of shields will be referred to as a shield-coupling MR element.

In the shield-coupling MR element described above, the lower one of the pair of shields which lies closer to the substrate will be referred to as a first shield, and the upper one will be referred to as a second shield. The lower one of the pair of free layers will be referred to as a first free layer, and the upper one will be referred to as a second free layer. In the shield-coupling MR element, the MR stack and the second shield are stacked in this order on the first shield. The MR stack is patterned into a predetermined shape. The shield-coupling MR element has nonmagnetic layers that are disposed on opposite sides of the MR stack in the track width direction, between the first shield and the second shield.

In order to achieve high recording density, it is needed to reduce the read gap length and reduce the track width as well. To reduce the track width of the foregoing shield-coupling MR element, the MR stack needs to be made smaller in dimension in the track width direction.

In the shield-coupling MR element, the magnetic coupling between the second free layer and the second shield is difficult to secure if the MR stack is small in dimension in the track width direction in particular. In order to ensure the magnetic coupling between the second free layer and the second shield, the MR stack may be configured to include a magnetic cap layer that is located above the second free layer and magnetically coupled to the second free layer. Then, a ferromagnetic layer constituting the second shield may be arranged in contact with the top surface of the magnetic cap layer. When manufacturing the shield-coupling MR element of such a configuration, the MR stack and the nonmagnetic layers can be formed by the following lift-off method. In the method, a layered film that is to be patterned into the MR stack later is initially formed on the first shield. Next, a mask to be used for patterning the layered film is formed on the layered film. The layered film is then etched by using the mask. The nonmagnetic layers are then formed with the mask left intact. The mask is then removed. Next, the top surface of the magnetic cap layer is slightly etched to clean the top surface of the magnetic cap layer.

The mask to be used in the foregoing method has an undercut shape for easy removal later. An example of the method for forming an MR element by the lift-off technique using an undercut mask is disclosed in JP-A-2007-234646, for example.

The inventors of this application actually formed MR stacks and nonmagnetic layers by the foregoing method. As a result, the following problem was found to occur in association with the method. That is, with such a method, the undercut mask makes the shape of the top surface of the magnetic cap layer, which is the uppermost layer of the MR stack, a convex shape with both side portions lower in level than the center portion after the etching of the layered film. When the mask is removed and the top surface of the magnetic cap layer is cleaned, the top surface of the magnetic cap layer becomes more convex. If the top surface of the magnetic cap layer has a convex shape, it follows that the thickness of the magnetic cap layer varies according to the position within the area surrounded by the outer edges of the MR stack when the MR stack is seen from above. If the magnetic cap layer has such uneven thickness in the foregoing area, the stack consisting of the magnetic cap layer and the ferromagnetic layer that is disposed thereon and constitutes the second shield (hereinafter, referred to as the magnetic stack) also has uneven thickness in that area.

The exchange coupling magnetic field that causes magnetic coupling between the second free layer and the second shield depends on the thickness of the magnetic stack in the foregoing area. More specifically, the thicker the magnetic stack, the smaller the exchange coupling magnetic field. The smaller the exchange coupling magnetic field, the higher the shielding capability or flux-absorbing capability of the magnetic stack, but the lower the capability of controlling the direction of magnetization of the second free layer. It is therefore necessary to adjust the exchange coupling magnetic field to an appropriate value. If, as described above, the magnetic stack has uneven thickness in the foregoing area, the exchange coupling magnetic field becomes uneven in the area. This consequently makes the magnetic stack unstable both in its shielding capability and its capability of controlling the direction of magnetization of the second free layer. In such a case, it also becomes difficult to control the average exchange coupling magnetic field in each single MR element, so that characteristic variations among a plurality of MR elements increase. If the MR stack is reduced in dimension in the track width direction, in particular, the portions of the top surface of the magnetic cap layer that are lower in level than the center portion increase in proportion. This makes the foregoing problem even more significant.

U.S. Pat. No. 6,669,983 describes a method of forming an MR element without using the lift-off technique. In the method, a multilayer film that is to be patterned into the MR stack later is initially formed on a lower electrode film that also functions as a magnetic shield film. Next, the multilayer film is etched into the MR stack by using a photoresist pattern as a mask. An insulating film is then formed over the entire surface with the photoresist pattern left intact. Next, the insulating film is polished by chemical mechanical polishing (CMP) until only a small thickness of the photoresist pattern remains on the MR stack. The remaining photoresist pattern is then removed with a solvent. Next, an upper electrode film that also functions as a magnetic shield film is formed over the insulating film and the MR stack. Such a method has the problem of high manufacturing cost since the CMP process is needed. In addition, this method includes the removal of the photoresist pattern, which tends to produce resist residues on the top surface of the MR stack. Removing the resist residues by ashing or the like causes the problem that the MR stack becomes uneven in its top surface.

OBJECT AND SUMMARY OF THE INVENTION

It is an object of the present invention to provide a method of manufacturing a magnetoresistive element that has a pair of free layers coupled to a pair of shields, the method allowing stable magnetic coupling between the upper one of the free layers and the upper one of the shields.

A magnetoresistive element to be manufactured by a manufacturing method of the present invention includes: first and second main shield layers; and first and second antiferromagnetic layers, first and second exchange coupling shield layers, an MR stack, and a nonmagnetic layer that are disposed between the first and second main shield layers. The first main shield layer, the first antiferromagnetic layer, the first exchange coupling shield layer, the MR stack, the second exchange coupling shield layer, the second antiferromagnetic layer, and the second main shield layer are stacked in this order. The nonmagnetic layer is disposed around the MR stack, between the first and second exchange coupling shield layers. The MR stack includes: a spacer layer made of a nonmagnetic material; a first free layer disposed between the first exchange coupling shield layer and the spacer layer; a second free layer disposed between the second exchange coupling shield layer and the spacer layer; and a magnetic cap layer made of a magnetic material and disposed between the second free layer and the second exchange coupling shield layer. The first exchange coupling shield layer is exchange-coupled to the first antiferromagnetic layer. The second exchange coupling shield layer is exchange-coupled to the second antiferromagnetic layer. The first free layer is magnetically coupled to the first exchange coupling shield layer and thereby has a controlled direction of magnetization. The magnetic cap layer is in contact with the second exchange coupling shield layer and is magnetically coupled to the second exchange coupling shield layer. The second free layer is magnetically coupled to the second exchange coupling shield layer via the magnetic cap layer and thereby has a controlled direction of magnetization.

The method of manufacturing the magnetoresistive element of the present invention includes the steps of forming the first main shield layer; forming the first antiferromagnetic layer after the formation of the first main shield layer; forming the first exchange coupling shield layer after the formation of the first antiferromagnetic layer; forming the MR stack and the nonmagnetic layer after the formation of the first exchange coupling shield layer; forming the second exchange coupling shield layer after the formation of the MR stack and the nonmagnetic layer; and forming the second main shield layer after the formation of the second exchange coupling shield layer.

The step of forming the MR stack and the nonmagnetic layer includes the steps of forming a layered film that is to be patterned into the MR stack later; forming a protection layer on a top surface of the layered film, the protection layer including a protection layer body that is in contact with the top surface of the layered film and dissolves during wet etching to be performed later; forming a mask on the protection layer, the mask being intended for use for patterning the layered film; etching the layered film and the protection layer by using the mask; forming the nonmagnetic layer with the mask left intact; removing the mask; and removing the protection layer at least by wet etching so that the magnetic cap layer is exposed.

In the manufacturing method of the present invention, the mask may have an undercut shape.

In the manufacturing method of the present invention, the step of forming the MR stack and the nonmagnetic layer may further include the step of cleaning a top surface of the magnetic cap layer by etching after the step of removing the protection layer.

In the manufacturing method of the present invention, the protection layer body may be made of alumina. The step of removing the protection layer may use an alkaline etching solution in the wet etching.

In the manufacturing method of the present invention, the protection layer may further include an adhesion film formed on the protection layer body. The mask may be formed on the adhesion film. In such a case, the adhesion film may be made of Ta.

In the manufacturing method of the present invention, the step of etching the layered film and the protection layer may employ ion milling using ion beams in more than one direction of travel.

In the manufacturing method of the present invention, one of the first exchange coupling shield layer and the second exchange coupling shield layer may include a nonmagnetic middle layer that is made of a nonmagnetic conductive material, and two ferromagnetic layers that are antiferromagnetically exchange-coupled to each other via the nonmagnetic middle layer. The other of the first exchange coupling shield layer and the second exchange coupling shield layer may include one or more ferromagnetic layers and no nonmagnetic middle layer.

According to the method of manufacturing the magnetoresistive element of the present invention, in the step of forming the MR stack and the nonmagnetic layer, a protection layer is formed on the top surface of a layered film that is to be patterned into the MR stack later, and then the layered film and the protection layer are etched by using a mask. Subsequently, the nonmagnetic layer is formed with the mask left intact. After the removal of the mask, the protection layer is removed at least by wet etching. Consequently, according to the present invention, it is possible to flatten the top surface of the magnetic cap layer which is the uppermost layer of the MR stack. According to the present invention, it is thus possible to provide stable magnetic coupling between the second free layer which is the upper one of the free layers and the second exchange coupling shield layer which is the upper one of the exchange coupling shield layers.

Other and further objects, features and advantages of the present invention will appear more fully from the following description.

DETAILED DESCRIPTION OF THE PREFERRED EMBODIMENT

Figure 9:
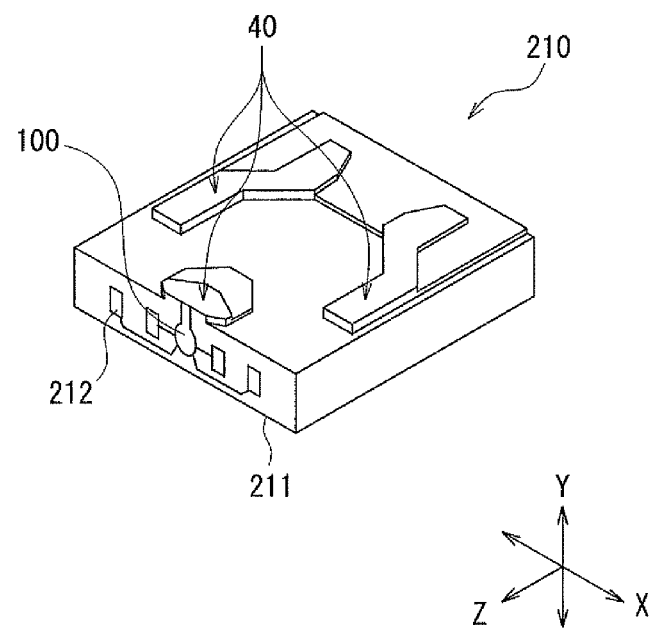
FIG. 9 is a perspective view of a slider including the magnetic head of the embodiment of the invention.

An embodiment of the present invention will now be described in detail with reference to the drawings. First, reference is made to FIG. 9 to describe a slider 210 including a thin-film magnetic head (hereinafter, simply referred to as a magnetic head) of the embodiment of the invention. The magnetic head of the present embodiment is for use in perpendicular magnetic recording. In a magnetic recording device, the slider 210 is disposed to face a circular-plate-shaped recording medium (a magnetic disk) that is driven to rotate. In FIG. 9, the X direction is a direction across the tracks of the recording medium, the Y direction is a direction perpendicular to the surface of the recording medium, and the Z direction is the direction of travel of the recording medium as seen from the slider 210. The X, Y, and Z directions are orthogonal to one another. The slider 210 has a base body 211. The base body 211 is nearly hexahedron-shaped. One of the six surfaces of the base body 211 is designed to face the surface of the recording medium. At this one of the six surfaces, there is formed a medium facing surface 40 to face the recording medium. When the recording medium rotates and travels in the Z direction, an airflow passing between the recording medium and the slider 210 causes a lift below the slider 210 in the Y direction of FIG. 9. The lift causes the slider 210 to fly over the surface of the recording medium. The magnetic head 100 of the present embodiment is formed near the air-outflow-side end (the end in the Z direction) of the slider 210. A plurality of terminals 212 are also provided at the air-outflow-side end of the slider 210.

A head assembly of the present embodiment will now be described with reference to FIG. 10. The head assembly of the present embodiment includes the slider 210 shown in FIG. 9 and a supporter that flexibly supports the slider 210. Forms of the head assembly include a head gimbal assembly and a head arm assembly described below.

A description will initially be given of the head gimbal assembly 220. The head gimbal assembly 220 includes the slider 210, and a suspension 221 serving as the supporter that flexibly supports the slider 210. The suspension 221 includes: a plate-spring-shaped load beam 222 formed of, e.g., stainless steel; a flexure 223 to which the slider 210 is joined, the flexure 223 being provided at an end of the load beam 222 and giving an appropriate degree of freedom to the slider 210; and a base plate 224 provided at the other end of the load beam 222. The base plate 224 is configured to be attached to an arm 230 of an actuator for moving the slider 210 along the X direction across the tracks of the recording medium 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 10:
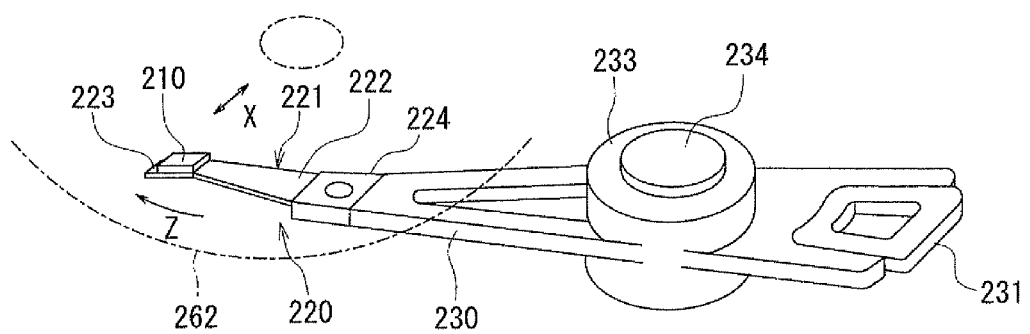
FIG. 10 is a perspective view of a head arm assembly of the embodiment of the invention.

FIG. 10 shows the head arm assembly of the present embodiment. In the head arm assembly, the head gimbal assembly 220 is attached to an end of the arm 230. A coil 231 that forms part of the voice coil motor is fixed to the other end of the arm 230. A bearing 233 is provided in the middle of the arm 230. The bearing 233 is attached to a shaft 234 for rotatably supporting the arm 230.

Figure 11:
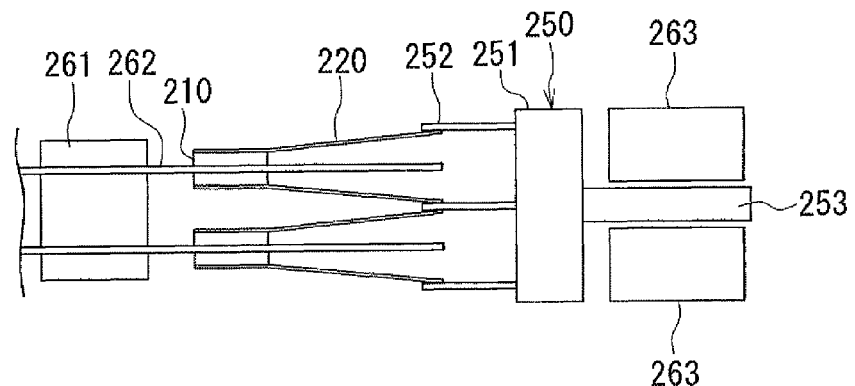
FIG. 11 is an explanatory diagram illustrating the main part of a magnetic disk drive of the embodiment of the invention.
Figure 12:
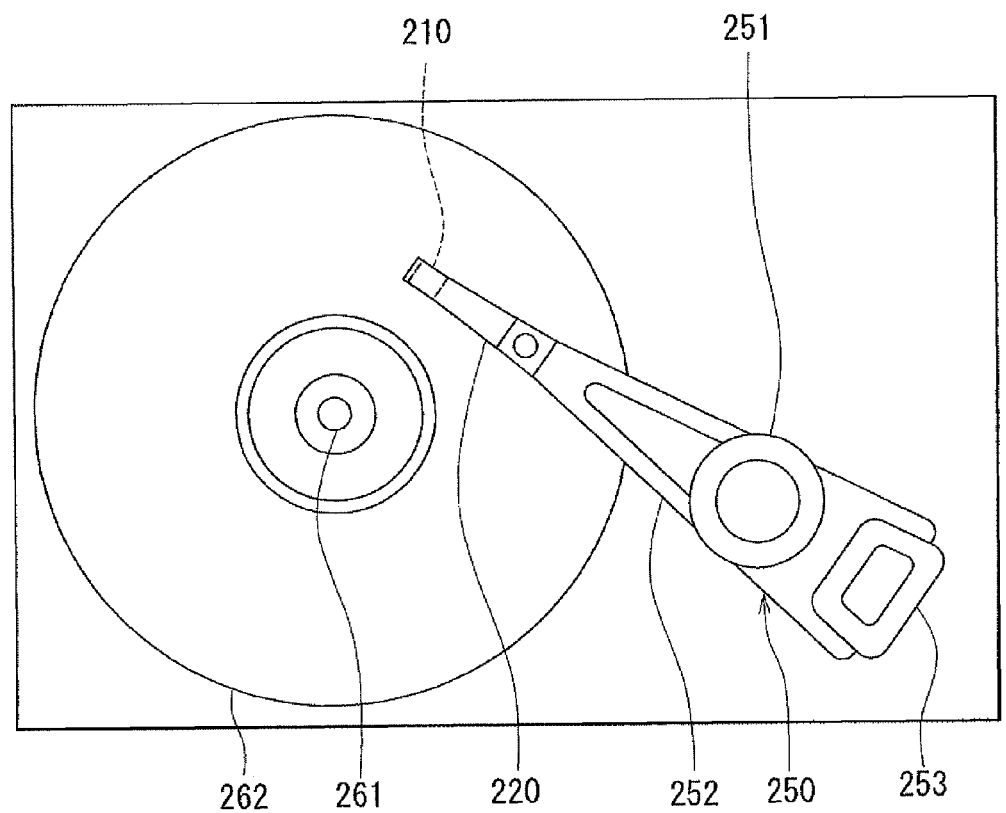
FIG. 12 is a plan view of the magnetic disk drive of the embodiment of the invention.

Reference is now made to FIG. 11 and FIG. 12 to describe an example of the head stack assembly and the magnetic recording device of the present embodiment. FIG. 11 is an explanatory diagram showing the main part of the magnetic recording device. FIG. 12 is a plan view of the magnetic recording device. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 that is part of the voice coil motor is mounted on a side of the carriage 251 opposite from the arms 252. The head stack assembly 250 is installed in the magnetic recording device. The magnetic recording device includes a plurality of recording media 262 mounted on a spindle motor 261. Two sliders 210 are allocated to each recording medium 262 such that the two sliders 210 are opposed to each other with the recording medium 262 interposed therebetween. The voice coil motor includes permanent magnets 263 arranged to be opposed to each other with the coil 253 of the head stack assembly 250 interposed therebetween. The actuator and the head stack assembly 250 except the sliders 210 support the sliders 210 and position them with respect to the recording media 262.

In the magnetic recording device of the present embodiment, the actuator moves the slider 210 across the tracks of the recording medium 262 and positions the slider 210 with respect to the recording medium 262. The magnetic head included in the slider 210 writes data on the recording medium 262 with the write head, and reads data stored on the recording medium 262 with the read head.

Figure 4:
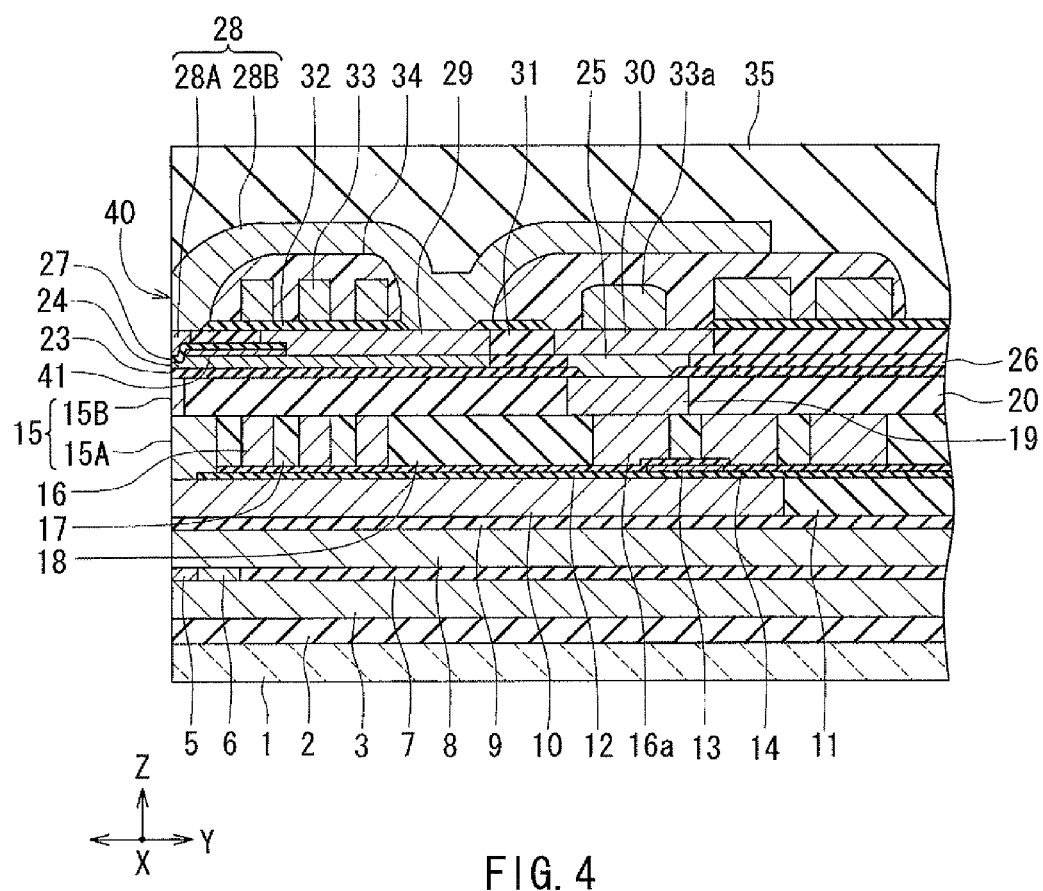
FIG. 4 is a cross-sectional view showing the configuration of a magnetic head of the embodiment of the invention.
Figure 5:
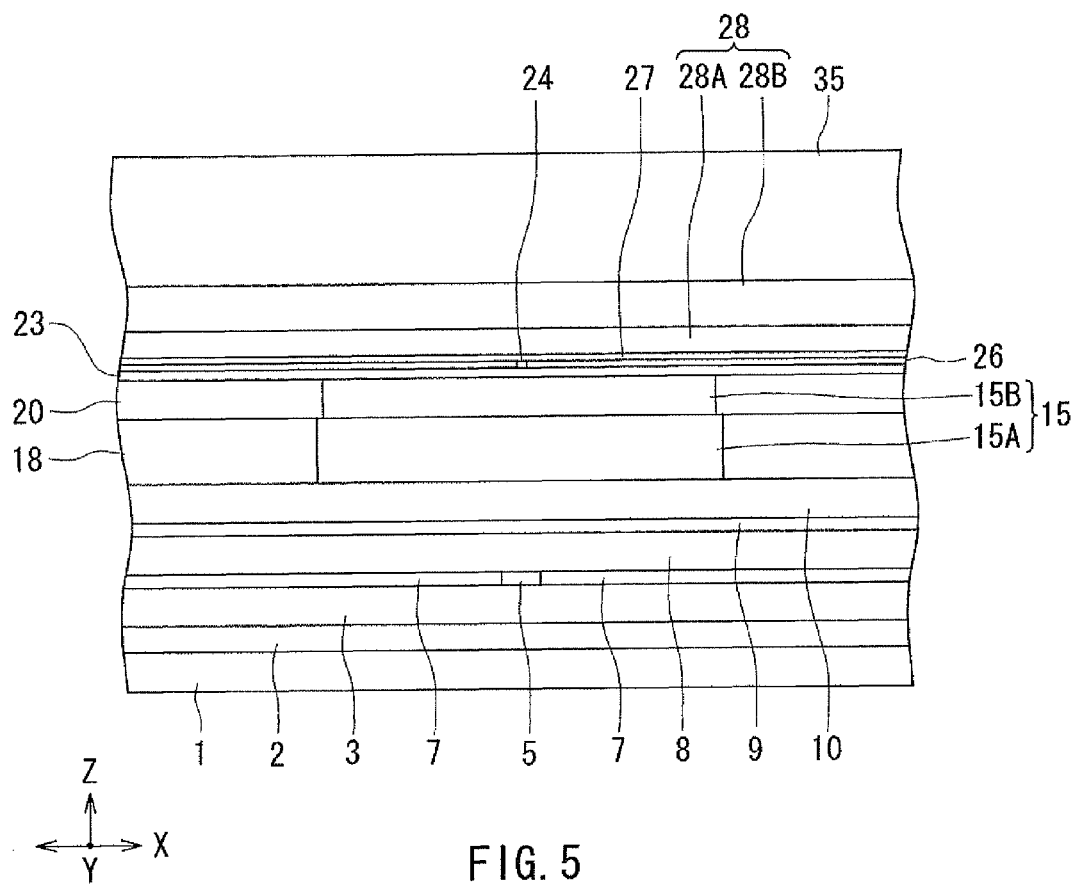
FIG. 5 is a front view showing the medium facing surface of the magnetic head of the embodiment of the invention.

Reference is now made to FIG. 4 and FIG. 5 to describe the configuration of the magnetic head of the present embodiment. FIG. 4 is a cross-sectional view showing the configuration of the magnetic head. FIG. 5 is a front view showing the medium facing surface of the magnetic head. Note that FIG. 4 shows a cross section perpendicular to the medium facing surface and the top surface of the substrate. The X, Y, and Z directions shown in FIG. 9 are also shown in FIG. 4 and FIG. 5. In FIG. 4, the X direction is orthogonal to the Y and Z directions. In FIG. 5, the Y direction is orthogonal to the X and Z directions.

As shown in FIG. 4, the magnetic head of the present embodiment has the medium facing surface 40 facing the recording medium. As shown in FIG. 4 and FIG. 5, the magnetic head includes: a substrate 1 made of a ceramic material such as aluminum oxide-titanium carbide ($Al_2O_3$—TiC); an insulating layer 2 made of an insulating material such as alumina ($Al_2O_3$) and disposed on the substrate 1; a first read shield portion 3 disposed on the insulating layer 2; and an MR stack 5, a bias magnetic field applying layer 6 and an insulating refill layer 7 that are disposed on the first read shield portion 3.

The MR stack 5 has a bottom surface in contact with the first read shield portion 3, a top surface on the opposite side from the bottom surface, a front end face located in the medium facing surface 40, a rear end face on the opposite side from the front end face, and two side surfaces located on opposite sides in the track width direction (X direction of FIG. 5). The bias magnetic field applying layer 6 is disposed to be adjacent to the rear end face of the MR stack 5, with a not-shown insulating film interposed between the MR stack 5 and the layer 6. The insulating refill layer 7 is disposed around the MR stack 5 and the bias magnetic field applying layer 6.

The magnetic head further includes a second read shield portion 8 disposed over the MR stack 5, the bias magnetic field applying layer 6 and the insulating refill layer 7, and a separating layer 9 made of a nonmagnetic material such as alumina and disposed on the second read shield portion 8.

The parts from the first read shield portion 3 to the second read shield portion 8 constitute a magnetoresistive element (hereinafter referred to as MR element) according to the present embodiment. The MR element constitutes the read head of the magnetic head. The configuration of the MR element will be described in detail later.

The magnetic head further includes a magnetic layer 10 made of a magnetic material and disposed on the separating layer 9, and an insulating layer 11 made of an insulating material such as alumina and disposed around the magnetic layer 10. The magnetic layer 10 has an end face located in the medium facing surface 40. The magnetic layer 10 and the insulating layer 11 are flattened at the top.

The magnetic head further includes an insulating film 12 disposed over the magnetic layer 10 and the insulating layer 11, a heater 13 disposed on the insulating film 12, and an insulating film 14 disposed over the insulating film 12 and the heater 13 so that the heater 13 is interposed between the insulating films 12 and 14. The function and material of the heater 13 will be described later. The insulating films 12 and 14 are each made of an insulating material such as alumina.

The magnetic head further includes a first write shield 15 disposed on the magnetic layer 10. The first write shield 15 includes a first layer 15A disposed on the magnetic layer 10, and a second layer 15B disposed on the first layer 15A. The first layer 15A and the second layer 15B are each made of a magnetic material. The first layer 15A and the second layer 15B each have an end face located in the medium facing surface 40. In the example shown in FIG. 4, the second layer 15B has a length smaller than that of the first layer 15A in the direction perpendicular to the medium facing surface 40 (Y direction of FIG. 4). However, the length of the second layer 15B in the direction perpendicular to the medium facing surface 40 may be equal to or greater than that of the first layer 15A in the direction perpendicular to the medium facing surface 40.

The magnetic head further includes a coil 16 made of a conductive material and disposed on the insulating film 14, an insulating layer 17 that fills the space between the coil 16 and the first layer 15A and the space between every adjacent turns of the coil 16, and an insulating layer 18 disposed around the first layer 15A, the coil 16 and the insulating layer 17. The coil 16 is planar spiral-shaped. The coil 16 includes a connecting portion 16a which is a portion near the inner end of the coil 16 and connected to another coil described later. The insulating layer 17 is made of photoresist, for example. The insulating layer 18 is made of alumina, for example. The first layer 15A, the coil 16, the insulating layer 17, and the insulating layer 18 are flattened at the top.

The magnetic head further includes a connecting layer 19 made of a conductive material and disposed on the connecting portion 16a, and an insulating layer 20 made of an insulating material such as alumina and disposed around the second layer 15B and the connecting layer 19. The connecting layer 19 may be made of the same material as the second layer 15B. The second layer 15B, the connecting layer 19, and the insulating layer 20 are flattened at the top.

The magnetic head further includes a first gap layer 23 disposed over the second layer 15B, the connecting layer 19, and the insulating layer 20. The first gap layer 23 has an opening formed in the area corresponding to the top surface of the connecting layer 19. The first gap layer 23 is made of a nonmagnetic insulating material such as alumina.

The magnetic head further includes a pole layer 24 made of a magnetic material and disposed on the first gap layer 23, a connecting layer 25 made of a conductive material and disposed on the connecting layer 19, and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as the pole layer 24.

The magnetic head further includes a nonmagnetic layer 41 made of a nonmagnetic material and disposed on part of the top surface of the pole layer 24. The nonmagnetic layer 41 is made of an inorganic insulating material or a metal material, for example. Examples of the inorganic insulating material to be used for the nonmagnetic layer 41 include alumina and $SiO_2$. Examples of the metal material to be used for the nonmagnetic layer 41 include Ru and Ti.

The magnetic head further includes a second gap layer 27 disposed over a part of the pole layer 24 and the nonmagnetic layer 41. A part of the top surface of the pole layer 24 apart from the medium facing surface 40 and the top surface of the connecting layer 25 are not covered with the nonmagnetic layer 41 and the second gap layer 27. The second gap layer 27 is made of a nonmagnetic material such as alumina.

The magnetic head further includes a second write shield 28 disposed on the second gap layer 27. The second write shield 28 includes a first layer 28A disposed to be adjacent to the second gap layer 27, and a second layer 28B disposed on a side of the first layer 28A opposite from the second gap layer 27 and connected to the first layer 28A. The first layer 28A and the second layer 28B are each made of a magnetic material. The first layer 28A and the second layer 28B each have an end face located in the medium facing surface 40.

The magnetic head further includes a yoke layer 29 made of a magnetic material and disposed on a part of the pole layer 24 away from the medium facing surface 40, a connecting layer 30 made of a conductive material and disposed on the connecting layer 25, and an insulating layer 31 made of an insulating material such as alumina and disposed around the first layer 28A, the yoke layer 29 and the connecting layer 30. The yoke layer 29 and the connecting layer 30 may be made of the same material as the first layer 28A. The first layer 28A, the yoke layer 29, the connecting layer 30, and the insulating layer 31 are flattened at the top.

The magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a part of the top surface of the yoke layer 29 near an end thereof farther from the medium facing surface 40, and an opening for exposing the top surface of the connecting layer 30.

The magnetic head further includes a coil 33 made of a conductive material and disposed on the insulating layer 32. The coil 33 is planar spiral-shaped. The coil 33 includes a connecting portion 33a which is a portion near the inner end of the coil 33 and connected to the connecting portion 16a of the coil 16. The connecting portion 33a is connected to the connecting layer 30, and is connected to the connecting portion 16a via the connecting layers 19, 25, and 30.

The magnetic head further includes an insulating layer 34 disposed to cover the coil 33. The insulating layer 34 is made of photoresist, for example. The second layer 28B of the second write shield 28 is disposed over the first layer 28A, the yoke layer 29 and the insulating layer 34, and connects the first layer 28A and the yoke layer 29 to each other.

The magnetic head further includes an overcoat layer 35 made of an insulating material such as alumina and disposed to cover the second layer 28B. The parts from the magnetic layer 10 to the second layer 28B constitute the write head. The base body 211 of FIG. 9 is mainly composed of the substrate 1 and the overcoat layer 35 of FIG. 4.

As has been described, the magnetic head has the medium facing surface 40 facing the recording medium, and includes the read head and the write head. The read head and the write head are stacked on the substrate 1. The read head is disposed backward along the direction of travel of the recording medium (Z direction) (in other words, disposed closer to the air-inflow end of the slider), while the write head is disposed forward along the direction of travel of the recording medium (Z direction) (in other words, disposed closer to the air-outflow end of the slider). The magnetic head writes data on the recording medium with the write head, and reads data stored on the recording medium with the read head.

As shown in FIG. 4, the read head includes the first and second read shield portions 3 and 8, the MR stack 5 disposed between the first and second read shield portions 3 and 8 near the medium facing surface 40 in order to detect a signal magnetic field sent from the recording medium, the bias magnetic field applying layer 6, and the insulating refill layer 7. The bias magnetic field applying layer 6 is disposed to be adjacent to the rear end face of the MR stack 5, with a not-shown insulating film interposed between the MR stack 5 and the layer 6. The insulating refill layer 7 is disposed around the MR stack 5 and the bias magnetic field applying layer 6. The MR stack 5 is either a TMR element or a GMR element of the CPP structure. A sense current is fed to the MR stack 5 in a direction intersecting the planes of layers constituting the MR stack 5, such as the direction perpendicular to the planes of the layers constituting the MR stack 5. The MR stack 5 changes in resistance in response to an external magnetic field, that is, a signal magnetic field sent from the recording medium. The resistance of the MR stack 5 can be determined from the sense current. It is thus possible, with the read head, to read data stored on the recording medium.

The write head includes the magnetic layer 10, the first write shield 15, the coil 16, the first gap layer 23, the pole layer 24, the nonmagnetic layer 41, the second gap layer 27, the second write shield 28, the yoke layer 29, and the coil 33. The first write shield 15 is located closer to the substrate 1 than is the second write shield 28. The pole layer 24 is located closer to the substrate 1 than is the second write shield 28.

The coils 16 and 33 produce a magnetic field that corresponds to data to be written on the recording medium. The pole layer 24 has an end face located in the medium facing surface 40, allows a magnetic flux corresponding to the magnetic field produced by the coils 16 and 33 to pass, and produces a write magnetic field to be used for writing the data on the recording medium by means of the perpendicular magnetic recording system.

The first write shield 15 is made of a magnetic material, and has an end face located in the medium facing surface 40 at a position backward of the end face of the pole layer 24 along the direction of travel of the recording medium (Z direction). The first gap layer 23 is made of a nonmagnetic material, has an end face located in the medium facing surface 40, and is disposed between the first write shield 15 and the pole layer 24. In the present embodiment, the first write shield 15 includes the first layer 15A disposed on the magnetic layer 10 and the second layer 15B disposed on the first layer 15A. Part of the coil 16 is located on a side of the first layer 15A so as to pass through the space between the magnetic layer 10 and the pole layer 24.

The magnetic layer 10 has the function of returning a magnetic flux that has been generated from the end face of the pole layer 24 and has magnetized the recording medium. FIG. 4 shows an example where the magnetic layer 10 has an end face located in the medium facing surface 40. Alternatively, the magnetic layer 10 may have an end face that is closer to the medium facing surface 40 and located at a distance from the medium facing surface 40, since the magnetic layer 10 is connected to the first write shield 15 having an end face located in the medium facing surface 40.

In the medium facing surface 40, the end face of the first write shield 15 (the end face of the second layer 15B) is located backward of the end face of the pole layer 24 along the direction of travel of the recording medium (Z direction) (in other words, located closer to the air-inflow end of the slider) with a predetermined small distance provided therebetween by the first gap layer 23. The distance between the end face of the pole layer 24 and the end face of the first write shield 15 in the medium facing surface 40 is preferably in the range of 0.05 to 0.7 µm, or more preferably in the range of 0.1 to 0.3 µm.

The first write shield 15 takes in a magnetic flux that is generated from the end face of the pole layer 24 located in the medium facing surface 40 and that expands in directions other than the direction perpendicular to the plane of the recording medium, and thereby prevents the flux from reaching the recording medium. It is thereby possible to improve the recording density.

The second write shield 28 is made of a magnetic material, and has an end face located in the medium facing surface 40 at a position forward of the end face of the pole layer 24 along the direction of travel of the recording medium (Z direction). The second gap layer 27 is made of a nonmagnetic material, has an end face located in the medium facing surface 40, and is disposed between the second write shield 28 and the pole layer 24. In the present embodiment, the second write shield 28 includes the first layer 28A disposed adjacent to the second gap layer 27, and the second layer 28B disposed on a side of the first layer 28A opposite from the second gap layer 27 and connected to the first layer 28A. Part of the coil 33 is arranged to pass through the space surrounded by the pole layer 24 and the second write shield 28. The second write shield 28 is connected to a part of the yoke layer 29 away from the medium facing surface 40. The second write shield 28 is thus connected to a part of the pole layer 24 away from the medium facing surface 40 via the yoke layer 29. The pole layer 24, the second write shield 28, and the yoke layer 29 form a magnetic path that passes a magnetic flux corresponding to the magnetic field produced by the coil 33.

In the medium facing surface 40, the end face of the second write shield 28 (the end face of the first layer 28A) is located forward of the end face of the pole layer 24 along the direction of travel of the recording medium (Z direction) (in other words, located closer to the air-outflow end of the slider) with a predetermined small distance provided therebetween by the second gap layer 27. The distance between the end face of the pole layer 24 and the end face of the second write shield 28 in the medium facing surface 40 is preferably equal to or smaller than 200 nm, or more preferably in the range of 25 to 50 nm, so that the second write shield 28 can fully exhibit its shield function.

The position of the end of a bit pattern to be written on the recording medium depends on the position of an end of the pole layer 24 in the medium facing surface 40, the end being closer to the second gap layer 27. The second write shield 28 takes in a magnetic flux that is generated from the end face of the pole layer 24 located in the medium facing surface 40 and that expands in directions other than the direction perpendicular to the plane of the recording medium, and thereby prevents the flux from reaching the recording medium. It is thereby possible to improve the recording density. The second write shield 28 also takes in a disturbance magnetic field that is applied to the magnetic head from the outside thereof. It is thereby possible to prevent erroneous writing on the recording medium caused by the disturbance magnetic field intensively taken into the pole layer 24. The second write shield 28 also has the function of returning a magnetic flux that has been generated from the end face of the pole layer 24 and has magnetized the recording medium.

FIG. 4 shows an example where neither the magnetic layer 10 nor the first write shield 15 is connected to the pole layer 24. Nevertheless, the magnetic layer 10 may be connected to a part of the pole layer 24 away from the medium facing surface 40. The coil 16 is not an essential component of the write head and can be dispensed with. In the example shown in FIG. 4, the yoke layer 29 is disposed on the pole layer 24, that is, disposed forward of the pole layer 24 along the direction of travel of the recording medium (Z direction) (in other words, disposed closer to the air-outflow end of the slider). Alternatively, the yoke layer 29 may be disposed below the pole layer 24, that is, backward of the pole layer 24 along the direction of travel of the recording medium (Z direction) (in other words, closer to the air-inflow end of the slider).

The heater 13 is provided for heating the components of the write head including the pole layer 24 so as to control the distance between the recording medium and the end face of the pole layer 24 located in the medium facing surface 40. Two not-shown leads are connected to the heater 13. The heater 13 is formed of an NiCr film or a layered film composed of a Ta film, an NiCu film and a Ta film, for example. The heater 13 generates heat by being energized through the two leads, and thereby heats the components of the write head. As a result, the components of the write head expand and the end face of the pole layer 24 located in the medium facing surface 40 thereby gets closer to the recording medium.

While FIG. 4 and FIG. 5 show a write head for use in the perpendicular magnetic recording system, the write head of the present embodiment may be one for use in the longitudinal magnetic recording system.

A method of manufacturing the magnetic head of the present embodiment will now be outlined. In the method of manufacturing the magnetic head of the embodiment, components of a plurality of magnetic heads are initially formed on a single substrate (wafer) to fabricate a substructure that includes a plurality of rows of pre-slider portions, the pre-slider portions being intended to become individual sliders later. Next, the substructure is cut into a slider aggregate that includes a row of pre-slider portions. Next, a surface formed in the slider aggregate by cutting the substructure is polished into the medium facing surfaces 40 of the pre-slider portions included in the slider aggregate. Next, flying rails are formed in the medium facing surfaces 40. Next, the slider aggregate is cut so as to separate the plurality of pre-slider portions from one another. This forms a plurality of sliders including their respective magnetic heads.

Figure 1:
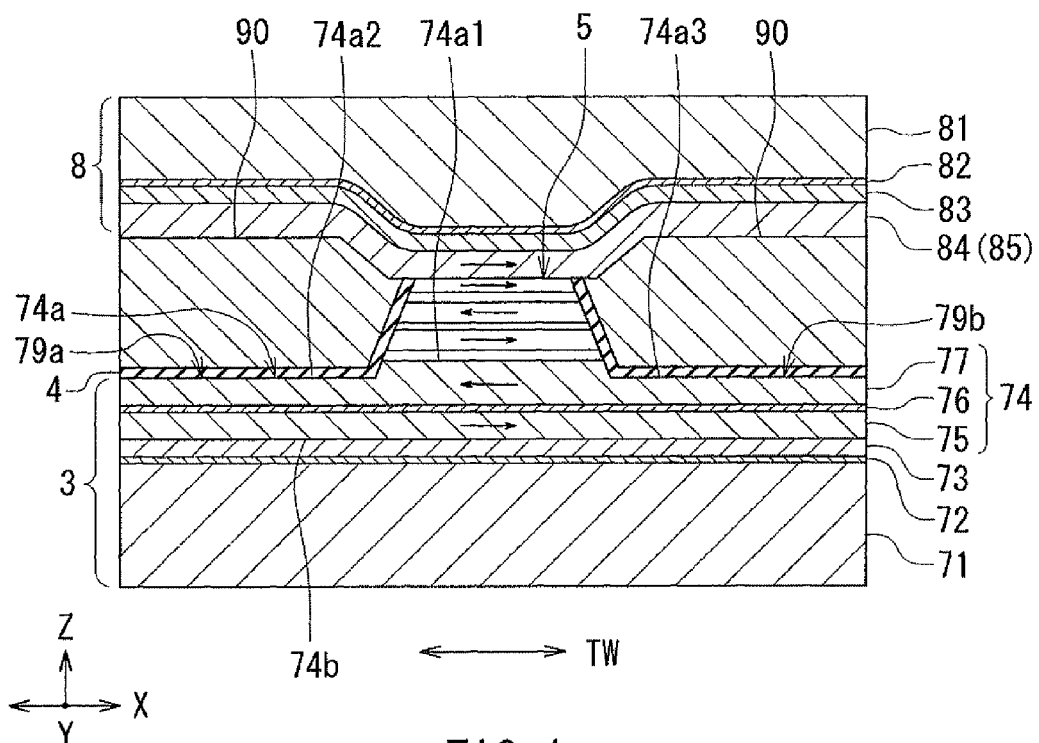
FIG. 1 is a cross-sectional view showing a cross section of a magnetoresistive element according to an embodiment of the invention parallel to the medium facing surface.
Figure 2:
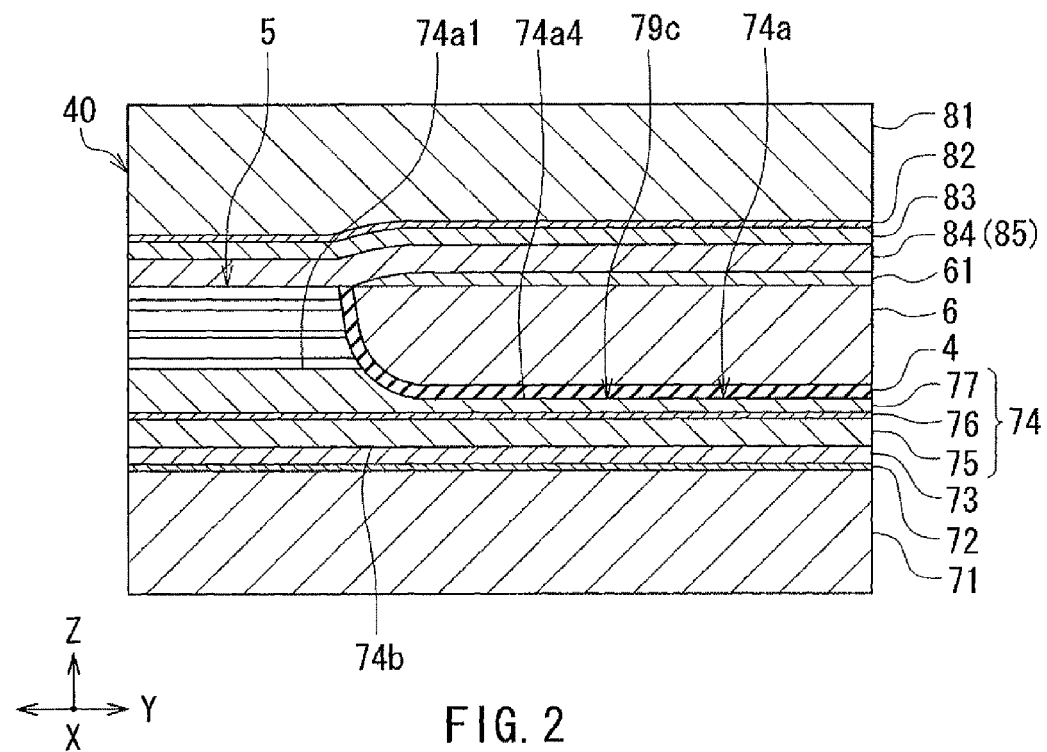
FIG. 2 is a cross-sectional view showing a cross section of the magnetoresistive element of FIG. 1 perpendicular to the medium facing surface and the top surface of the substrate.
Figure 3:
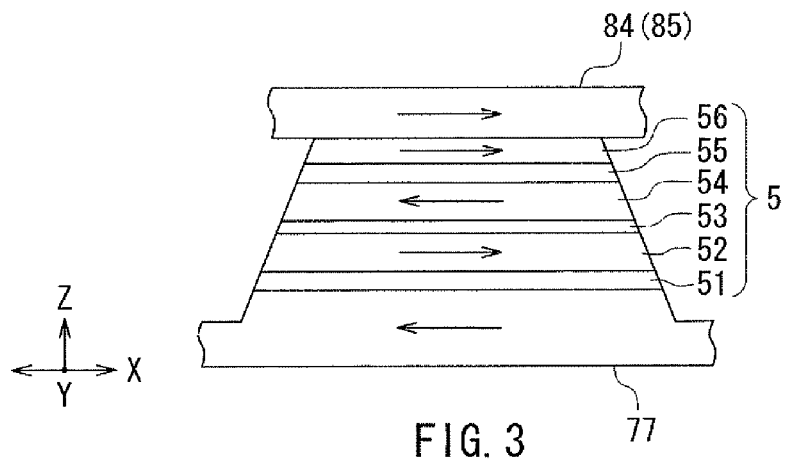
FIG. 3 is an enlarged cross-sectional view of the MR stack of FIG. 1 and its vicinity.

Now, with reference to FIG. 1 to FIG. 3, the configuration of the MR element according to the present embodiment will be described in detail. FIG. 1 is a cross-sectional view showing a cross section of the MR element parallel to the medium facing surface 40. FIG. 2 is a cross-sectional view showing a cross section of the MR element perpendicular to the medium facing surface 40 and the top surface of the substrate 1. FIG. 3 is an enlarged cross-sectional view of the MR stack of FIG. 1 and its vicinity. The X, Y, and Z directions shown in FIG. 9 are also shown in FIG. 1 to FIG. 3. In FIG. 1 and FIG. 3, the Y direction is orthogonal to the X and Z directions. In FIG. 2, the X direction is orthogonal to the Y and Z directions. In FIG. 1, the arrow with the symbol TW indicates the track width direction. The track width direction TW is the same as the X direction.

The MR element includes the first read shield portion 3 and the second read shield portion 8, and also includes the MR stack 5 and two nonmagnetic layers 90 that are disposed between the first and second read shield portions 3 and 8. The MR stack 5 and the second read shield portion 8 are stacked in this order on the first read shield portion 3. The planar shape (the shape as seen from above) of the MR stack 5 is smaller than that of each of the read shield portions 3 and 8.

The first read shield portion 3 includes a first main shield layer 71, and also includes an underlayer 72, a first antiferromagnetic layer 73, and a first exchange coupling shield layer 74 that are stacked in this order on the first main shield layer 71.

The second read shield portion 8 includes a second exchange coupling shield layer 84, a second antiferromagnetic layer 83, a nonmagnetic cap layer 82, and a second main shield layer 81 that are stacked in this order on the MR stack 5.

The MR element thus includes the first main shield layer 71 and the second main shield layer 81, and the underlayer 72, the nonmagnetic cap layer 82, the first antiferromagnetic layer 73, the second antiferromagnetic layer 83, the first exchange coupling shield layer 74, the second exchange coupling shield layer 84, the MR stack 5, and the two nonmagnetic layers 90 that are disposed between the first main shield layer 71 and the second main shield layer 81. The first main shield layer 71, the underlayer 72, the first antiferromagnetic layer 73, the first exchange coupling shield layer 74, the MR stack 5, the second exchange coupling shield layer 84, the second antiferromagnetic layer 83, the nonmagnetic cap layer 82, and the second main shield layer 81 are stacked in this order. The two nonmagnetic layers 90 are disposed around the MR stack 5, between the first exchange coupling shield layer 74 and the second exchange coupling shield layer 84.

The MR element further includes an insulating film 4, the bias magnetic field applying layer 6, a protection layer 61, and the insulating refill layer 7 that are disposed between the first read shield portion 3 and the second read shield portion 8. The insulating film 4 covers the two side surfaces and the rear end face of the MR stack 5, and also covers the top surface of the first read shield portion 3 except the area on which the MR stack 5 is disposed. The insulating film 4 is made of an insulating material such as alumina.

The two nonmagnetic layers 90 are disposed to be adjacent to the two side surfaces of the MR stack 5, respectively, with the insulating film 4 interposed between the MR stack 5 and the nonmagnetic layers 90. The nonmagnetic layers 90 are made of a nonmagnetic metal material. The material of the nonmagnetic layers 90 may be Cr, Ti, CrTi, Ta, or Ru, for example.

The bias magnetic field applying layer 6 is disposed to be adjacent to the rear end face of the MR stack 5, with the insulating film 4 interposed between the MR stack 5 and the bias magnetic field applying layer 6. The bias magnetic field applying layer 6 is made mainly of a hard magnetic material (permanent magnet material) such as CoPt or CoCrPt. The bias magnetic field applying layer 6 may be composed of Cr as an underlayer and CoPt formed on the underlayer, for example. The protection layer 61 is disposed between the bias magnetic field applying layer 6 and the second read shield portion 8. The protection layer 61 is made of a nonmagnetic conductive material such as Cr.

The insulating refill layer 7 is disposed around the nonmagnetic layers 90 and the bias magnetic field applying layer 6. The insulating refill layer 7 is made of an insulating material such as alumina.

The first exchange coupling shield layer 74 is exchange-coupled to the first antiferromagnetic layer 73. The second exchange coupling shield layer 84 is exchange-coupled to the second antiferromagnetic layer 83. In the present embodiment, one of the first exchange coupling shield layer 74 and the second exchange coupling shield layer 84 includes a nonmagnetic middle layer that is made of a nonmagnetic conductive material, and two ferromagnetic layers that are antiferromagnetically exchange-coupled to each other via the nonmagnetic middle layer. The other of the first exchange coupling shield layer 74 and the second exchange coupling shield layer 84 includes one or more ferromagnetic layers, but does not include any nonmagnetic middle layer. FIG. 1 and FIG. 2 show an example where the first exchange coupling shield layer 74 includes a nonmagnetic middle layer that is made of a nonmagnetic conductive material, and two ferromagnetic layers that are antiferromagnetically exchange-coupled to each other via the nonmagnetic middle layer. In this example, the second exchange coupling shield layer 84 includes one or more ferromagnetic layers but does not include any nonmagnetic middle layer.

In the example, the first exchange coupling shield layer 74 includes a nonmagnetic middle layer 76 which is made of a nonmagnetic conductive material, and two ferromagnetic layers 75 and 77 which are antiferromagnetically exchange-coupled to each other via the nonmagnetic middle layer 76. The ferromagnetic layer 75 is disposed between the first antiferromagnetic layer 73 and the nonmagnetic middle layer 76, and is exchange-coupled to the first antiferromagnetic layer 73. The ferromagnetic layer 77 is disposed between the nonmagnetic middle layer 76 and the MR stack 5, and is antiferromagnetically exchange-coupled to the ferromagnetic layer 75 via the nonmagnetic middle layer 76 by the RKKY interaction. The nonmagnetic middle layer 76 contains, for example, at least one element selected from the group consisting of Ru, Rh, Ir, Cr, Cu, Ag, Au, Pt, and Pd. In the example, the second exchange coupling shield layer 84 includes only a ferromagnetic layer 85 and no nonmagnetic middle layer. The ferromagnetic layer 85 is exchange-coupled to the second antiferromagnetic layer 83. Alternatively, contrary to this example, the second exchange coupling shield layer 84 may include a nonmagnetic middle layer, and two ferromagnetic layers that are antiferromagnetically exchanged-coupled to each other via the nonmagnetic middle layer. In such a configuration, the first exchange coupling shield layer 74 includes one or more ferromagnetic layers and no nonmagnetic middle layer.

The main shield layers 71 and 81 and the ferromagnetic layers 75, 77, and 85 are each made of a soft magnetic material such as NiFe, CoFe, CoFeB, CoFeNi, or FeN. The main shield layers 71 and 81 and the ferromagnetic layers 75, 77, and 85 each have a shield function of absorbing an excessive magnetic flux.

The underlayer 72 and the nonmagnetic cap layer 82 are each made of a nonmagnetic conductive material. The underlayer 72 contains at least one of Ta and Ru, for example. The nonmagnetic cap layer 82 is made of NiCr, for example.

The antiferromagnetic layers 73 and 83 are each made of an antiferromagnetic material. The antiferromagnetic material to be used for the antiferromagnetic layers 73 and 83 may be a non-heat-induced antiferromagnetic material or a heat-induced antiferromagnetic material. Examples of the non-heat-induced antiferromagnetic material include a Mn alloy that has a γ phase, such as FeMn or IrMn. Examples of the heat-induced antiferromagnetic material include a Mn alloy that has a regular crystal structure, such as PtMn or NiMn.

The ferromagnetic layer 75 of the first exchange coupling shield layer 74 is exchange-coupled to the first antiferromagnetic layer 73, whereby the ferromagnetic layer 75 is made into a single magnetic domain such that the ferromagnetic layer 75 is magnetized in a certain direction. Similarly, the ferromagnetic layer 85 of the second exchange coupling shield layer 84 is exchange-coupled to the second antiferromagnetic layer 83, whereby the ferromagnetic layer 85 is made into a single magnetic domain such that the ferromagnetic layer 85 is magnetized in a certain direction. The directions of magnetization of the ferromagnetic layers 75 and 85 are set by annealing in a magnetic field, and are determined by the direction of the magnetic field at that time. The ferromagnetic layers 75 and 85 thus have the same direction of magnetization. Specifically, the ferromagnetic layers 75 and 85 have the same direction of magnetization parallel to the track width direction TW.

In the first exchange coupling shield layer 74, the ferromagnetic layer 77 is antiferromagnetically exchange-coupled to the ferromagnetic layer 75 via the nonmagnetic middle layer 76. This makes the directions of magnetization of the ferromagnetic layers 75 and 77 antiparallel to each other, whereby the ferromagnetic layer 77 is made into a single magnetic domain such that the ferromagnetic layer 77 is magnetized in a certain direction. Consequently, the directions of magnetization of the ferromagnetic layers 85 and 77 are antiparallel to each other.

As shown in FIG. 3, the MR stack 5 includes a spacer layer 53 made of a nonmagnetic material, a first free layer 52 disposed between the first exchange coupling shield layer 74 (ferromagnetic layer 77) and the spacer layer 53, a second free layer 54 disposed between the second exchange coupling shield layer 84 (ferromagnetic layer 85) and the spacer layer 53, and a magnetic cap layer 56 made of a magnetic material and disposed between the second free layer 54 and the second exchange coupling shield layer 84 (ferromagnetic layer 85). The free layers 52 and 54 and the magnetic cap layer 56 are all ferromagnetic layers. The MR stack 5 further includes a nonmagnetic conductive layer 51 disposed between the first exchange coupling shield layer 74 (ferromagnetic layer 77) and the first free layer 52, and a nonmagnetic conductive layer 55 disposed between the second free layer 54 and the magnetic cap layer 56.

The free layers 52 and 54 are each made of a ferromagnetic material having a low coercivity, such as NiFe, CoFe, CoFeB, CoFeNi, or FeN.

If the MR stack 5 is a TMR element, the spacer layer 53 is a tunnel barrier layer. In such a case, the spacer layer 53 is made of an insulating material such as alumina, $SiO_2$, or MgO. If the MR stack 5 is a GMR element of the CPP structure, the spacer layer 53 is a nonmagnetic conductive layer. In such a case, the spacer layer 53 is made of, for example, a nonmagnetic conductive material such as Ru, Rh, Ir, Re, Cr, Zr or Cu, or an oxide semiconductor material such as ZnO, $In_2O_3$ or $SnO_2$.

The nonmagnetic conductive layer 51 is in contact with the bottom surface of the first free layer 52 and the top surface of the ferromagnetic layer 77. The nonmagnetic conductive layer 55 is in contact with the top surface of the second free layer 54 and the bottom surface of the magnetic cap layer 56. The nonmagnetic conductive layers 51 and 55 are each made of a nonmagnetic conductive material containing at least one of Ru, Rh, Ir, Cr, Cu, Ag, Au, Pt, and Pd, for example.

The magnetic cap layer 56 is in contact with the top surface of the nonmagnetic conductive layer 55 and the bottom surface of the ferromagnetic layer 85. The magnetic cap layer 56 is made of a soft magnetic material such as NiFe, CoFe, CoFeB, CoFeNi, or FeN. The magnetic cap layer 56 and the ferromagnetic layer 85 may be made of the same material.

The ferromagnetic layer 77 of the first exchange coupling shield layer 74 and the first free layer 52 are antiferromagnetically exchange-coupled to each other via the nonmagnetic conductive layer 51 by the RKKY interaction. The directions of magnetization of the first free layer 52 and the ferromagnetic layer 77 are therefore antiparallel to each other. In this way, the first free layer 52 is magnetically coupled to the first exchange coupling shield layer 74 and thereby has a controlled direction of magnetization.

The magnetic cap layer 56 is in contact with the ferromagnetic layer 85 of the second exchange coupling shield layer 84 and is magnetically coupled to the ferromagnetic layer 85. The ferromagnetic layer 85 and the magnetic cap layer 56 have the same direction of magnetization. The magnetic cap layer 56 and the second free layer 54 are antiferromagnetically exchange-coupled to each other via the nonmagnetic conductive layer 55 by the RKKY interaction. The directions of magnetization of the magnetic cap layer 56 and the second free layer 54 are therefore antiparallel to each other. Consequently, the directions of magnetization of the second free layer 54 and the ferromagnetic layer 85 are antiparallel to each other. In this way, the second free layer 54 is magnetically coupled to the second exchange coupling shield layer 84 via the magnetic cap layer 56, and thereby has a controlled direction of magnetization.

In the present embodiment, the directions of magnetization of the ferromagnetic layers 77 and 85 are antiparallel to each other. Suppose a state where the first and second free layers 52 and 54 are subjected to no external magnetic field except the magnetic fields that result from the first and second exchange coupling shield layers 74 and 84. When in such a state, the directions of magnetization of the first free layer 52 and the ferromagnetic layer 77 are antiparallel to each other, and the directions of magnetization of the second free layer 54 and the ferromagnetic layer 85 are also antiparallel to each other. Consequently, the directions of magnetization of the first free layer 52 and the second free layer 54 in such a state are antiparallel to each other.

When no magnetic field is applied to the MR element from the outside of the MR element, all of magnetic fields to be applied to the free layers 52 and 54, except the bias magnetic field produced by the bias magnetic field applying layer 6, result from the first and second exchange coupling shield layers 74 and 84. Therefore, the state where the free layers 52 and 54 are subjected to no external magnetic field except the magnetic fields that result from the first and second exchange coupling shield layers 74 and 84 refers to the state where the free layers 52 and 54 are not subjected to the bias magnetic field produced by the bias magnetic field applying layer 6 when no magnetic field is applied to the MR element from the outside of the MR element.

Possible configurations of the MR stack 5 of the present embodiment are not limited to the configuration shown in FIG. 3. For example, the nonmagnetic conductive layers 51 and 55 in the MR stack 5 may be replaced with first and second coupling layers each of which includes a plurality of nonmagnetic conductive layers and magnetic layers interposed between adjacent ones of the nonmagnetic conductive layers. Here, the first coupling layer and the second coupling layer shall include the same number of layers. This makes it possible to make the directions of magnetization of the first free layer 52 and the second free layer 54 antiparallel to each other.

Now, with reference to FIG. 1 and FIG. 2, a description will be given of the arrangement of the bias magnetic field applying layer 6 and the two nonmagnetic layers 90 in the present embodiment. As shown in FIG. 2, the bias magnetic field applying layer 6 is disposed between the first read shield portion 3 and the second read shield portion 8 so as to be adjacent to the rear end face of the MR stack 5 with the insulating film 4 interposed between the MR stack 5 and the layer 6. As shown in FIG. 1, the two nonmagnetic layers 90 are disposed between the first read shield portion 3 and the second read shield portion 8 so as to be adjacent to the two side surfaces of the MR stack 5 with the insulating film 4 interposed between the MR stack 5 and the nonmagnetic layers 90.

As shown in FIG. 1 and FIG. 2, the first exchange coupling shield layer 74 has a top surface 74a and a bottom surface 74b. The bottom surface 74b is in contact with the first antiferromagnetic layer 73. The top surface 74a includes a first portion 74a1, a second portion 74a2, a third portion 74a3, and a fourth portion 74a4. The first portion 74a1 is in contact with the MR stack 5. The second portion 74a2 and the third portion 74a3 are located closer to the bottom surface 74b than is the first portion 74a1 so that recesses 79a and 79b are formed below the two nonmagnetic layers 90. The fourth portion 74a4 is located closer to the bottom surface 74b than is the first portion 74a1 so that a recess 79c is formed below the bias magnetic field applying layer 6. The insulating film 4 is disposed over the second portion 74a2, the third portion 74a3, and the fourth portion 74a4. The bias magnetic field applying layer 6 and the nonmagnetic layers 90 are disposed on the insulating film 4.

The bias magnetic field applying layer 6 applies a bias magnetic field to the free layers 52 and 54 so that the directions of magnetization of the free layers 52 and 54 are changed from those in the state where no bias magnetic field is applied to the free layers 52 and 54. The bias magnetic field applying layer 6 preferably applies a bias magnetic field to the free layers 52 and 54 so that the directions of magnetization of the free layers 52 and 54 become orthogonal to each other.

The MR element according to the present embodiment is of the CPP structure. More specifically, a sense current, which is a current used for detecting a signal magnetic field, is fed in a direction intersecting the planes of the layers constituting the MR stack 5, such as the direction perpendicular to the planes of the layers constituting the MR stack 5. The first read shield portion 3 and the second read shield portion 8 also function as a pair of electrodes for feeding the sense current to the MR stack 5 in a direction intersecting the planes of the layers constituting the MR stack 5, such as the direction perpendicular to the planes of the layers constituting the MR stack 5.

Figure 6:
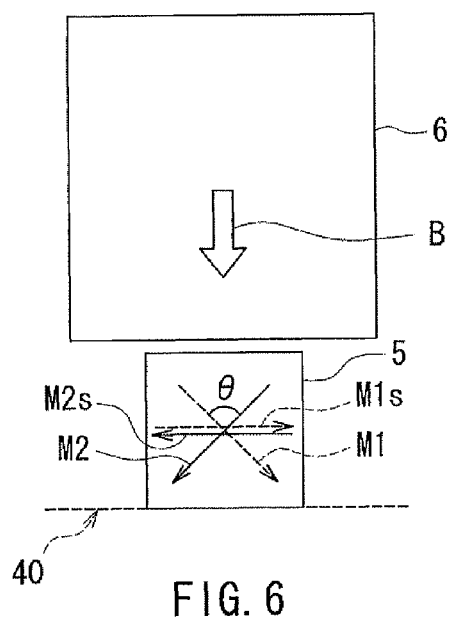
FIG. 6 is an explanatory diagram for explaining the operation of the magnetoresistive element according to the embodiment of the invention.
Figure 7:
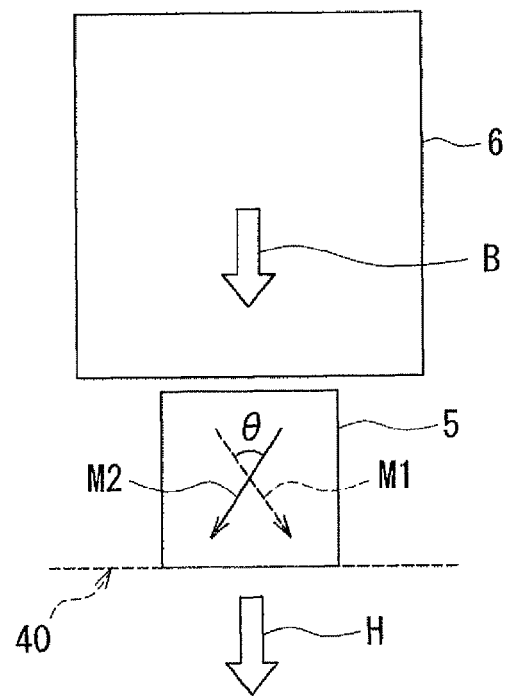
FIG. 7 is an explanatory diagram for explaining the operation of the magnetoresistive element according to the embodiment of the invention.
Figure 8:
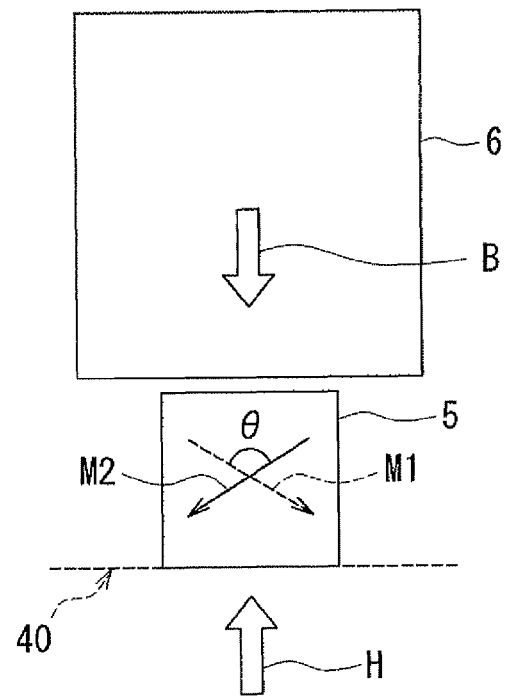
FIG. 8 is an explanatory diagram for explaining the operation of the magnetoresistive element according to the embodiment of the invention.

The operation of the MR element according to the present embodiment will now be described with reference to FIG. 6 to FIG. 8. FIG. 6 to FIG. 8 each show the MR stack 5 and the bias magnetic field applying layer 6. In FIG. 6 to FIG. 8, the arrow with the symbol "B" indicates the bias magnetic field produced by the bias magnetic field applying layer 6. The arrow with the symbol "M1s" indicates the direction of magnetization of the first free layer 52 when the first free layer 52 is not subjected to any external magnetic field (including bias magnetic field) other than the magnetic fields that result from the first and second exchange coupling shield layers 74 and 84. The arrow with the symbol "M2s" indicates the direction of magnetization of the second free layer 54 when the second free layer 54 is not subjected to any external magnetic field described above. The arrow with the symbol "M1" indicates the direction of magnetization of the first free layer 52 when the first free layer 52 is subjected to the bias magnetic field B. The arrow with the symbol "M2" indicates the direction of magnetization of the second free layer 54 when the second free layer 54 is subjected to the bias magnetic field B.

As shown in FIG. 6, the directions of magnetization of the free layers 52 and 54 are antiparallel to each other when the free layers 52 and 54 are not subjected to any external magnetic field. When the free layers 52 and 54 are subjected to the bias magnetic field B and no signal magnetic field, the directions of magnetization of the free layers 52 and 54 become non-antiparallel to each other. When in such a state, it is desirable that the directions of magnetization of the first free layer 52 and the second free layer 54 each form an angle of 45 degrees with respect to the medium facing surface 40 and the relative angle θ between the directions of magnetization of the free layers 52 and 54 be 90 degrees.

FIG. 7 shows a state where the free layers 52 and 54 are subjected to the bias magnetic field B and also a signal magnetic field H in the same direction as the bias magnetic field B. When in such a state, the angle that the direction of magnetization of the first free layer 52 forms with respect to the medium facing surface 40 and the angle that the direction of magnetization of the second free layer 54 forms with respect to the medium facing surface 40 are both greater as compared with the state shown in FIG. 6. Consequently, the relative angle θ between the directions of magnetization of the free layers 52 and 54 is smaller as compared with the state shown in FIG. 6.

FIG. 8 shows a state where the free layers 52 and 54 are subjected to the bias magnetic field B and also a signal magnetic field H in the direction opposite to the direction of the bias magnetic field B. When in such a state, the angle that the direction of magnetization of the first free layer 52 forms with respect to the medium facing surface 40 and the angle that the direction of magnetization of the second free layer 54 forms with respect to the medium facing surface 40 are both smaller as compared with the state shown in FIG. 6. Consequently, the relative angle θ between the directions of magnetization of the free layers 52 and 54 is greater as compared with the state shown in FIG. 6.

As seen above, the relative angle between the directions of magnetization of the free layers 52 and 54 changes in response to the signal magnetic field, and the change causes a change in resistance of the MR stack 5. The signal magnetic field can therefore be detected by detecting the resistance of the MR stack 5. The resistance of the MR stack 5 can be determined from the potential difference produced in the MR stack 5 when a sense current is fed to the MR stack 5. With the MR element, it is thus possible to read data stored on the recording medium.

A description will now be given of an example of specific configuration of the MR element of the present embodiment. Hereinafter, the MR element of this specific configuration will be referred to as an MR element of practical example. In the following description, the thickness of each layer will refer to the dimension of the layer in the stacking direction (the direction perpendicular to the top surface of the substrate 1) of a plurality of layers where the plurality of layers are stacked. Table 1 shows the respective configurations of the underlayer 72, the first antiferromagnetic layer 73, the first exchange coupling shield layer 74, and the MR stack 5 in the MR element of practical example.

TABLE 1

| Configuration of practical example | | Material | Thickness (nm) |
|---|---|---|---|
| MR stack 5 | Magnetic cap layer 56 | Magnetic layer NiFe | 5 |
| | | Magnetic layer CoFe | 1 |
| | Nonmagnetic conductive layer 55 | Ru | 0.8 |
| | Second free layer 54 | Magnetic layer NiFe | 3 |
| | | Magnetic layer CoFeB | 1 |
| | | Magnetic layer $Co_{30}Fe_{70}$ | 1 |
| | Spacer layer 53 | MgO | 3 |
| | First free layer 52 | Magnetic layer $Co_{30}Fe_{70}$ | 1 |
| | | Magnetic layer CoFeB | 1 |
| | | Magnetic layer NiFe | 3 |
| | Nonmagnetic conductive layer 51 | Ru | 0.8 |
| First exchange coupling shield layer 74 | Ferromagnetic layer 77 | Magnetic layer $Co_{90}Fe_{10}$ | 1 |
| | | Magnetic layer NiFe | 8 |
| | | Magnetic layer $Co_{90}Fe_{10}$ | 1 |
| | Nonmagnetic middle layer 76 | Ru | 0.8 |
| | Ferromagnetic layer 75 | Magnetic layer $Co_{90}Fe_{10}$ | 1 |
| | | Magnetic layer NiFe | 8 |
| | | Magnetic layer $Co_{90}Fe_{10}$ | 1 |
| First antiferromagnetic layer 73 | | IrMn | 7 |
| Underlayer 72 | | Nonmagnetic conductive layer Ru | 2 |
| | | Nonmagnetic conductive layer Ta | 1 |

In the practical example, the first free layer 52 and the second free layer 54 are each formed by stacking three magnetic layers, namely, an NiFe layer, a CoFeB layer, and a CoFe layer. The CoFe layer in each of the free layers 52 and 54 is composed of 30 atomic % Co and balance Fe. In the practical example, the spacer layer 53 is made of MgO. The spacer layer 53 is thus a tunnel barrier layer, and therefore the MR stack 5 is a TMR element.

In the practical example, the magnetic cap layer 56 is formed by stacking two magnetic layers, namely, a CoFe layer and an NiFe layer. It should be noted that the thickness of the NiFe layer of the magnetic cap layer 56 shown in Table 1 is the thickness before the cleaning to be described later. Combined with the second exchange coupling shield layer 84, the magnetic cap layer 56 functions as a shield that is disposed on the upper side of the MR stack 5. In the practical example, the read gap length is thus the distance from the bottom surface of the nonmagnetic conductive layer 51 to the top surface of the nonmagnetic conductive layer 55, which is 14.6 nm.

In the practical example, the ferromagnetic layers 75 and 77 of the first exchange coupling shield layer 74 are each formed by stacking three magnetic layers, namely, a CoFe layer, an NiFe layer, and a CoFe layer. While NiFe is typically used as a shield material, a CoFe layer is provided in the part of the ferromagnetic layer 75 that makes contact with the first antiferromagnetic layer 73. The aim is to increase the exchange coupling magnetic field that acts between the ferromagnetic layer 75 and the first antiferromagnetic layer 73. The CoFe layer in each of the ferromagnetic layers 75 and 77 may be composed of 70 to 90 atomic % Co and balance Fe, for example. In the practical example, the CoFe layer in each of the ferromagnetic layers 75 and 77 is composed of 90 atomic % Co and balance Fe. The underlayer 72 is formed by stacking two nonmagnetic conductive layers, namely, a Ta layer and a Ru layer. Note that in Table 1, a CoFe alloy that contains M atomic % Co and N atomic % Fe is expressed as $Co_MFe_N$.

In the practical example, the first and second main shield layers 71 and 81 are each formed of an NiFe layer. The first and second main shield layers 71 and 81 each have a thickness in the range of 0.5 to 2.0 μm, for example. In the practical example, the second antiferromagnetic layer 83 has the same configuration as that of the first antiferromagnetic layer 73. The ferromagnetic layer 85 of the second exchange coupling shield layer 84 has the same configuration as that of the ferromagnetic layer 75.

A method of manufacturing the MR element according to the present embodiment will now be described with reference to FIG. 1, FIG. 2, and FIG. 13 to FIG. 21. FIG. 13 to FIG. 21 each show a cross section of a stack of layers in the process of manufacturing the MR element, the cross section being perpendicular to the medium facing surface 40 and the top surface of the substrate 1. The portions lying below the main shield layer 71 are omitted in FIG. 13 to FIG. 15. The portions lying below the magnetic layer that is to become the ferromagnetic layer 77 later are omitted in FIG. 16 to FIG. 18. The portions lying below the ferromagnetic layer 77 are omitted in FIG. 19 to FIG. 21.

Figure 13:
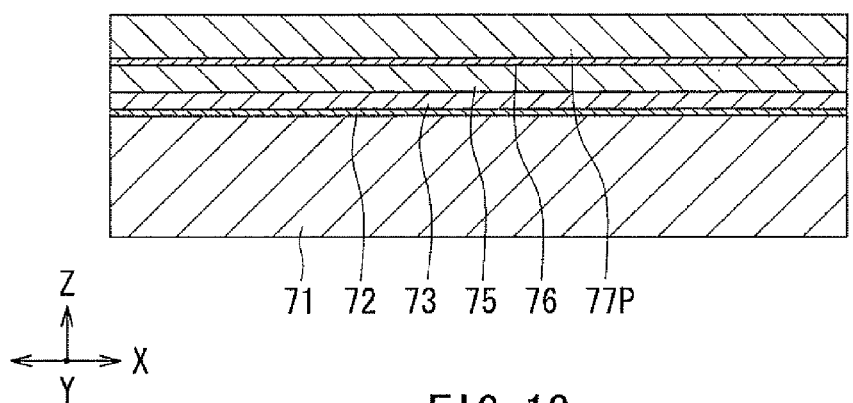
FIG. 13 is a cross-sectional view showing a step of a method of manufacturing the magnetoresistive element according to the embodiment of the invention.

In the method of manufacturing the MR element according to the present embodiment, as shown in FIG. 13, the first main shield layer 71 is initially formed into a predetermined pattern on the insulating layer 2 by frame plating, for example. Next, the underlayer 72, the first antiferromagnetic layer 73, the ferromagnetic layer 75, the nonmagnetic middle layer 76, and a magnetic layer 77P are formed in this order on the first main shield layer 71 by sputtering, for example. The magnetic layer 77P is to become the ferromagnetic layer 77 later.

Figure 14:
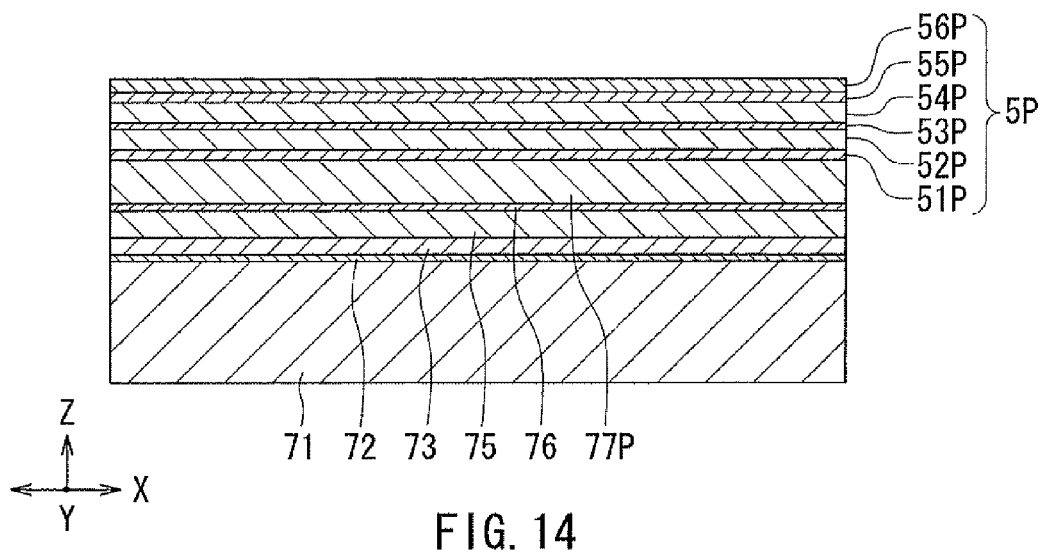
FIG. 14 is a cross-sectional view showing a step that follows the step of FIG. 13.

FIG. 14 shows the next step. This step forms a layered film 5P which is to be patterned into the MR stack 5 later. Specifically, the following films are formed in succession on the magnetic layer 77P by, for example, sputtering: a nonmagnetic film 51P to become the nonmagnetic conductive layer 51; a magnetic film 52P to become the first free layer 52; a nonmagnetic film 53P to become the spacer layer 53; a magnetic film 54P to become the second free layer 54; a nonmagnetic film 55P to become the nonmagnetic conductive layer 55; and a magnetic film 56P to become the magnetic cap layer 56.

Figure 15:
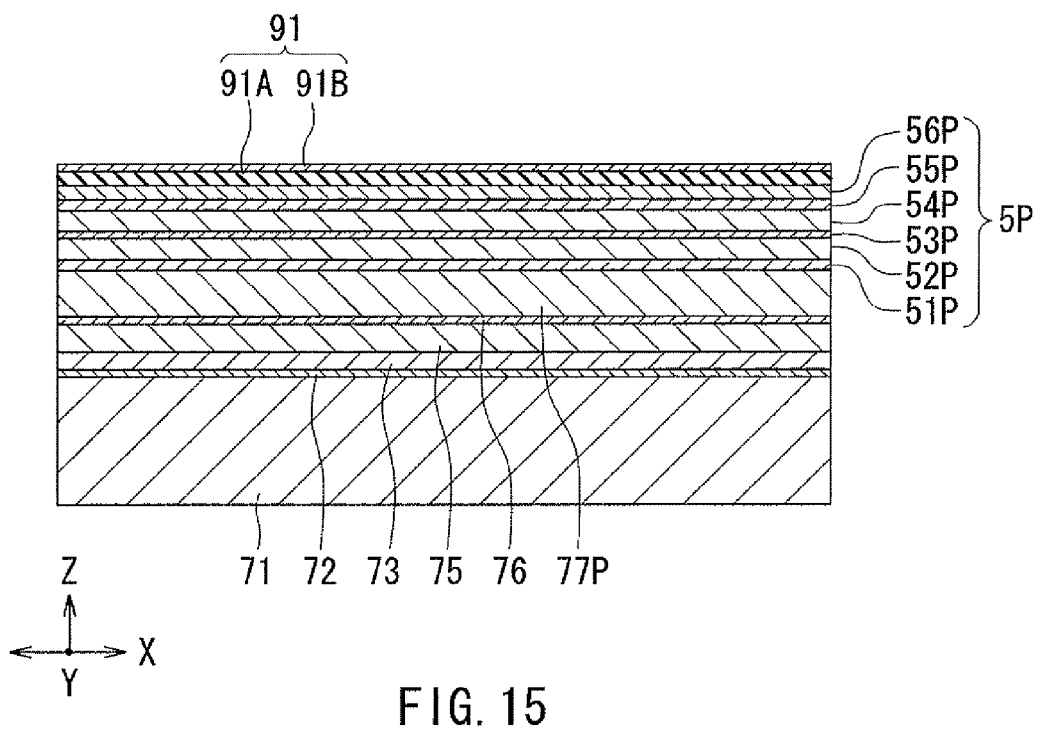
FIG. 15 is a cross-sectional view showing a step that follows the step of FIG. 14.

FIG. 15 shows the next step. In this step, a protection layer 91 is formed on the top surface of the layered film 5P. The protection layer 91 is to be removed at least by wet etching. The protection layer 91 includes a protection layer body 91A which is in contact with the top surface of the layered film 5P and dissolves during the wet etching, and an adhesion film 91B formed on the protection layer body 91A. It should be noted that the protection layer 91 need not necessarily include the adhesion film 91B. The protection layer body 91A and the adhesion film 91B are formed in this order by sputtering, for example. The protection layer body 91A has a thickness of around 3 nm, for example. The protection layer body 91A is made of alumina, for example. The adhesion film 91B is intended to improve the adhesion between the protection layer body 91A and a mask to be formed later. The adhesion film 91B has a thickness of around 1 nm, for example. The adhesion film 91B is made of Ta, for example.

Figure 16:
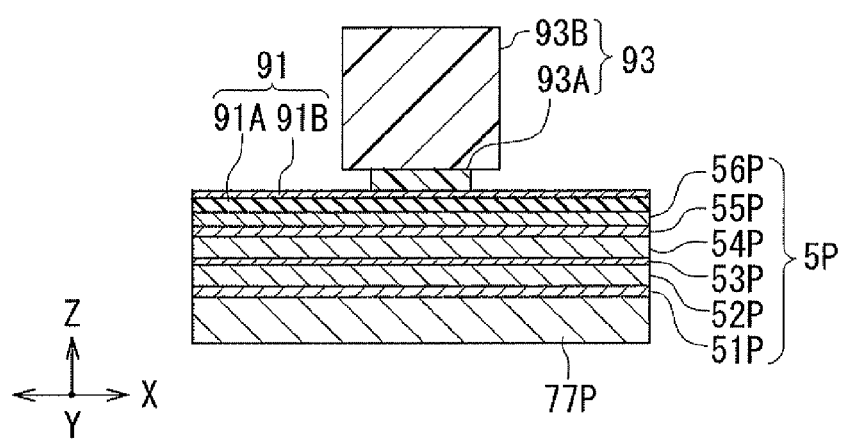
FIG. 16 is a cross-sectional view showing a step that follows the step of FIG. 15.

FIG. 16 shows the next step. In this step, a mask 93 to be used for patterning the layered film 5P is formed on the protection layer 91. If the protection layer 91 includes the adhesion film 91B, the mask 93 is formed on the adhesion film 91B. The mask 93 preferably has an undercut shape as shown in FIG. 16 for the sake of easy removal later. For example, the undercut mask 93 may be composed of a lower layer 93A and an upper layer 93B as shown in FIG. 16. The upper layer 93B is made of a photoresist that is patterned by photolithography. The lower layer 93A is made of, for example, a material that dissolves in a developing solution to be used when patterning the upper layer 93B.

Figure 17:
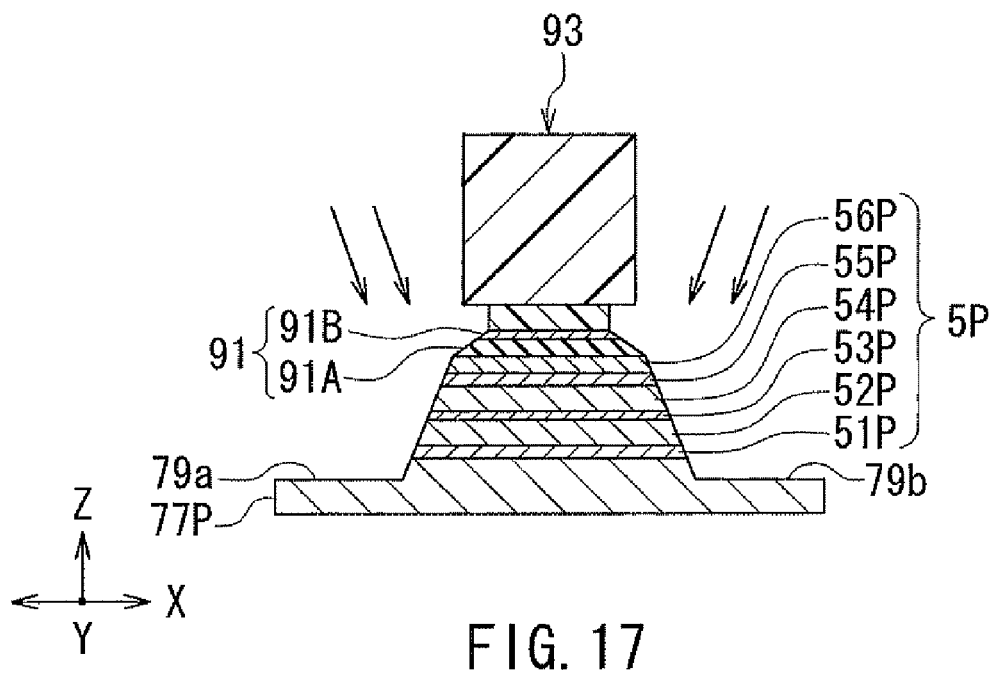
FIG. 17 is a cross-sectional view showing a step that follows the step of FIG. 16.

FIG. 17 shows the next step. In this step, the layered film 5P and the protection layer 91 are etched into a predetermined shape by, for example, ion milling, using the mask 93 as the etching mask. The layered film 5P is thereby patterned so that its dimension in the track width direction is equal to that of the MR stack 5 in the track width direction. In this step, the magnetic layer 77P is also etched partially in the areas where the two nonmagnetic layers 90 are to be disposed later. This forms the recesses 79a and 79b in the magnetic layer 77P. The arrows in FIG. 17 show ion beams.

Figure 18:
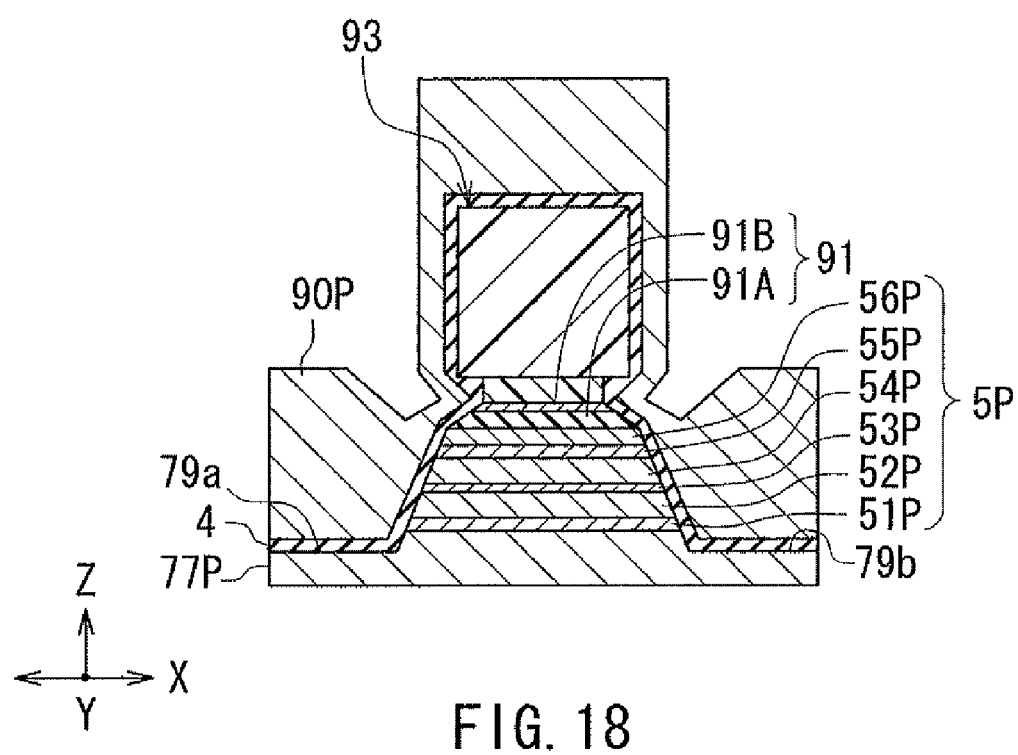
FIG. 18 is a cross-sectional view showing a step that follows the step of FIG. 17.

FIG. 18 shows the next step. In this step, the insulating film 4 and a nonmagnetic film 90P are initially formed in succession over the entire top surface of the stack shown in FIG. 17 by, for example, sputtering, with the mask 93 left intact. The nonmagnetic film 90P is to be made into the two nonmagnetic layers 90 later. As shown in FIG. 18, the insulating film 4 and the nonmagnetic film 90P both adhere to the surface of the mask 93 in part. The nonmagnetic film 90P has a smaller thickness in the vicinity of the layered film 5P because of the shading by the mask 93 as well as the insulating film 4 and the nonmagnetic film 90P adhering to the surface of the mask 93.

Next, the mask 93 is removed. Here, the respective portions of the insulating film 4 and the nonmagnetic film 90P adhering to the mask 93 are also removed together with the mask 93. In the step shown in FIG. 18, if the nonmagnetic film 90P is formed too thick in the portions thereof lying over the recesses 79a and 79b, such portions of the nonmagnetic film 90P and the portions of the nonmagnetic film 90P lying on the side surfaces of the mask 93 will bond to each other strongly. In such a case, it becomes difficult to remove the mask 93. The portions of the nonmagnetic film 90P lying over the recesses 79a and 79b should therefore have such a thickness as not to cause the above-described situation. For the practical example shown in Table 1, the portions of the nonmagnetic film 90P lying over the recesses 79a and 79b shall have a thickness of 25 nm, for example.

Next, although not shown in the drawings, the insulating refill layer 7, the bias magnetic field applying layer 6, and the protection layer 61 are formed in the following manner. First, a not-shown second mask is formed on the stack after the removal of the mask 93. The second mask covers at least a part of the protection layer 91 and a part of the nonmagnetic film 90P. Next, the layered film 5P, the protection layer 91, and the nonmagnetic film 90P are etched by, for example, ion milling, using the second mask as the etching mask. Next, the insulating refill layer 7 is formed over the entire top surface of the stack by, for example, sputtering, with the second mask left intact. The second mask is then removed.

Figure 19:
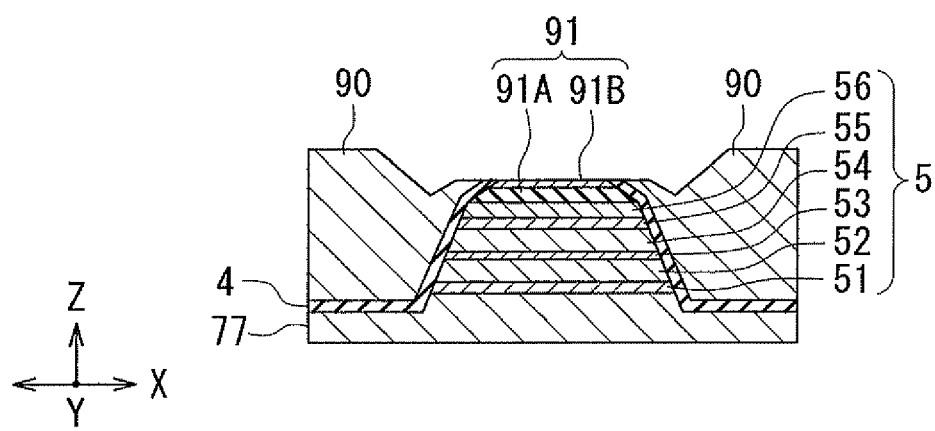
FIG. 19 is a cross-sectional view showing a step that follows the step of FIG. 18.

Next, a not-shown third mask is formed on the stack after the removal of the second mask. The third mask has an opening that has a shape corresponding to the planar shape of the bias magnetic field applying layer 6 to be formed later. Next, the layered film 5P, the protection layer 91, the nonmagnetic film 90P, and the insulating refill layer 7 are etched by, for example, ion milling, using the third mask as the etching mask. As a result, the remaining layered film 5P makes the MR stack 5, and the remaining nonmagnetic film 90P makes the two nonmagnetic layers 90. In this step, the magnetic layer 77P is also etched partially in the area where the bias magnetic field applying layer 6 is to be disposed later. This forms the recess 79c in the magnetic layer 77P. The remaining magnetic layer 77P makes the ferromagnetic layer 77. Next, the insulating film 4, the bias magnetic field applying layer 6, and the protection layer 61 are formed in this order by, for example, sputtering, with the third mask left intact. The bias magnetic field applying layer 6 is disposed over the recess 79c so as to be adjacent to the rear end face of the MR stack 5 (see FIG. 2) and the surface of the ferromagnetic layer 77 with the insulating film 4 interposed between the bias magnetic field applying layer 6 and each of the MR stack 5 and the ferromagnetic layer 77. The bias magnetic field applying layer 6 may be composed of a Cr layer formed on the insulating film 4 and a CoPt layer formed on the Cr layer. Next, the third mask is removed. FIG. 19 shows the stack after the removal of the third mask.

Figure 20:
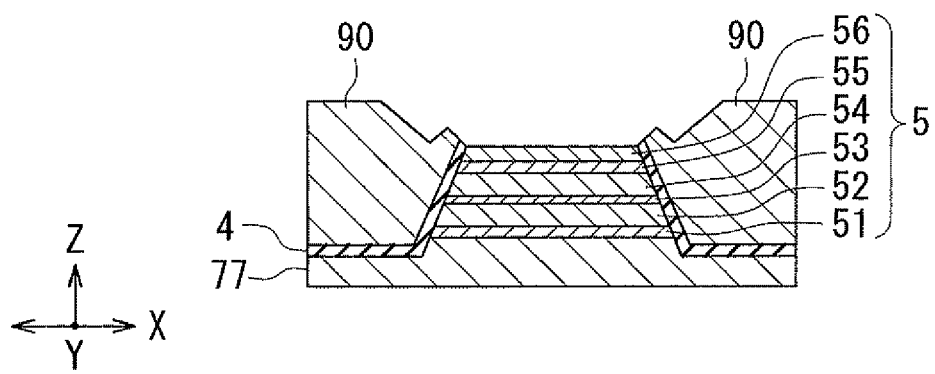
FIG. 20 is a cross-sectional view showing a step that follows the step of FIG. 19.

FIG. 20 shows the next step. In this step, the protection layer 91 is removed at least by wet etching. If the protection layer 91 includes the adhesion film 91B, this step begins with removing the adhesion film 91B by reverse sputtering, for example. Next, the protection layer body 91A is removed by wet etching so that the magnetic cap layer 56 is exposed. The wet etching is performed under such a condition that only the protection layer body 91A is etched while the magnetic cap layer 56 is hardly etched or not etched at all. For example, if the protection layer body 91A is made of alumina, an alkaline etching solution is used for the wet etching. This makes it possible to remove only the protection layer body 91A without damaging the top surface of the magnetic cap layer 56. The removal of the protection layer 91 uncovers the flat top surface of the magnetic cap layer 56. The top surface of the magnetic cap layer 56 is lower in level than its surroundings. As shown in FIG. 20, the top surfaces of the nonmagnetic layers 90 have ridges in the vicinity of the MR stack 5, the ridges protruding to a higher level than the top surface of the MR stack 5 (magnetic cap layer 56).

Figure 21:
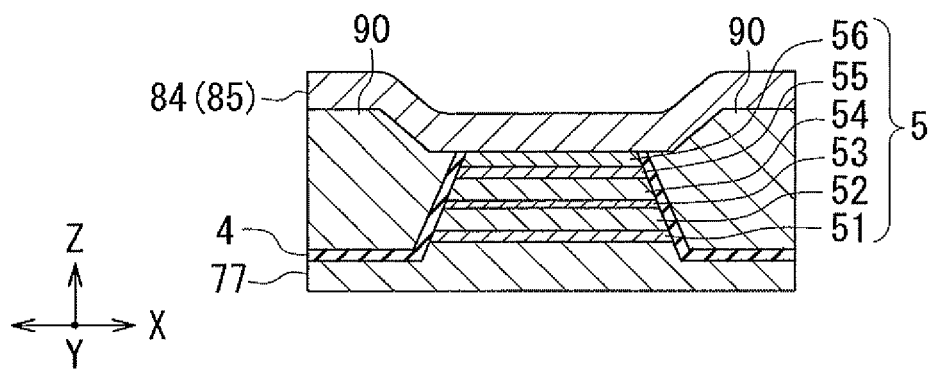
FIG. 21 is a cross-sectional view showing a step that follows the step of FIG. 20.

FIG. 21 shows the next step. In this step, the top surface of the magnetic cap layer 56 is initially cleaned by etching. Specifically, the top surface of the magnetic cap layer 56 is etched by reverse sputtering or ion milling, for example. The amount of etching of the magnetic cap layer 56 is around 3 nm, for example. Next, the ferromagnetic layer 85 is formed over the MR stack 5, the protection layer 61 and the nonmagnetic layers 90 by, for example, sputtering, so as to be in contact with the top surface of the magnetic cap layer 56.

Before the foregoing cleaning, as shown in FIG. 20, the top surface of the magnetic cap layer 56 is lower in level than its surroundings. This prevents both side portions of the top surface of the magnetic cap layer 56 in the track width direction (X direction) from being etched more and thereby becoming lower in level than the center portion during the foregoing cleaning. The top surface of the magnetic cap layer 56 can thus maintain flatness even after the cleaning.

During the cleaning, portions of the top surfaces of the nonmagnetic layers 90 (including the ridges) in the vicinity of the MR stack 5 are etched as well. Consequently, as shown in FIG. 21, the portions of the top surfaces of the nonmagnetic layers 90 in the vicinity of the MR stack 5 are flattened to the same level as the top surface of the magnetic cap layer 56.

Next, as shown in FIG. 1 and FIG. 2, the second antiferromagnetic layer 83 and the nonmagnetic cap layer 82 are formed in this order on the ferromagnetic layer 85 by sputtering, for example. Next, the second main shield layer 81 is formed into a predetermined pattern by frame plating, for example.

The directions of the magnetization of the ferromagnetic layers 75 and 85 and the direction of the magnetization of the bias magnetic field applying layer 6 are determined by separate magnetizing processes including annealing at different temperatures. It is possible to set the directions of magnetization of the ferromagnetic layers 75 and 85 and the direction of magnetization of the bias magnetic field applying layer 6 to be different from each other because of the difference in appropriate annealing temperature in the magnetizing processes on those layers.

The effect of the MR element according to the present embodiment will now be described. In the present embodiment, the ferromagnetic layer 75 of the first exchange coupling shield layer 74 is exchange-coupled to the first antiferromagnetic layer 73. The ferromagnetic layer 77 is antiferromagnetically exchange-coupled to the ferromagnetic layer 75 via the nonmagnetic middle layer 76. The direction of magnetization of the ferromagnetic layer 77 is thereby determined. Meanwhile, the ferromagnetic layer 85 of the second exchange coupling shield layer 84 is exchange-coupled to the second antiferromagnetic layer 83, whereby the direction of magnetization of the ferromagnetic layer 85 is determined. Consequently, the directions of magnetization of the ferromagnetic layers 85 and 77 are antiparallel to each other. The first free layer 52 is magnetically coupled to the ferromagnetic layer 77, and the second free layer 54 is magnetically coupled to the ferromagnetic layer 85. Specifically, the first free layer 52 is antiferromagnetically exchange-coupled to the ferromagnetic layer 77 via the nonmagnetic conductive layer 51. The second free layer 54 is antiferromagnetically exchange-coupled to the magnetic cap layer 56 via the nonmagnetic conductive layer 55, and is magnetically coupled to the second exchange coupling shield layer 84 via the magnetic cap layer 56. As a result, the directions of magnetization of the two free layers 52 and 54 are antiparallel to each other when the two free layers 52 and 54 are subjected to no external magnetic field except the magnetic fields that result from the first and second exchange coupling shield layers 74 and 84. According to the present embodiment, it is thus possible to maintain the directions of magnetization of the two free layers 52 and 54 antiparallel to each other when in the state where no external magnetic field is applied, without making use of antiferromagnetic coupling between the two free layers via the spacer layer 53. Consequently, according to the present embodiment, no limitation is imposed on the material and thickness of the spacer layer 53, in contrast to the case of making use of antiferromagnetic coupling between the two free layers.

Moreover, the present embodiment allows a reduction in read gap length because no antiferromagnetic layer is present between the MR stack 5 and each of the ferromagnetic layers 77 and 85 which each function as a shield. In the practical example shown in Table 1, the read gap length is 14.6 nm. This is much smaller than the read gap length of a typical spin-valve MR element, which is 30 nm or so.

The effect of the method of manufacturing the MR element according to the present embodiment will now be described in comparison with a method of manufacturing an MR element of a comparative example. First, the method of manufacturing an MR element of the comparative example will be described with reference to FIG. 22 to FIG. 27. FIG. 22 to FIG. 27 each show a cross section of a stack of layers in the process of manufacturing the MR element, the cross section being perpendicular to the medium facing surface 40 and the top surface of the substrate 1. The portions lying below the magnetic layer 77P are omitted in FIG. 22 to FIG. 24. The portions lying below the ferromagnetic layer 77 are omitted in FIG. 25 to FIG. 27. The MR stack 5 of the comparative example has a magnetic cap layer 156 instead of the magnetic cap layer 56 of the present embodiment. The steps of the method of manufacturing an MR element of the comparative example are the same as those of the method of manufacturing the MR element according to the present embodiment up to the step of forming the magnetic layer 77P.

Figure 22:
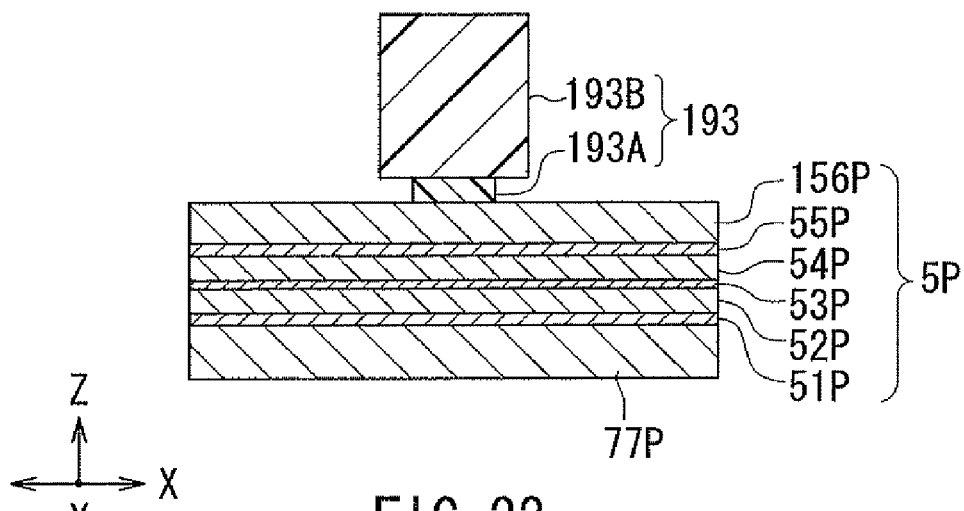
FIG. 22 is a cross-sectional view showing a step of a method of manufacturing a magnetoresistive element of a comparative example.

FIG. 22 shows the step after the formation of the magnetic layer 77P. In this step, a layered film 5P is initially formed. The layered film 5P of the comparative example includes a magnetic film 156P instead of the magnetic film 56P formed in the method of manufacturing the MR element according to the present embodiment. The magnetic film 156P is to become the magnetic cap layer 156 later. Next, a mask 193 to be used for patterning the layered film 5P is formed on the magnetic film 156P. The mask 193 has an undercut shape like the mask 93. The mask 193 is composed of, for example, a lower layer 193A and an upper layer 193B like the mask 93.

Figure 23:
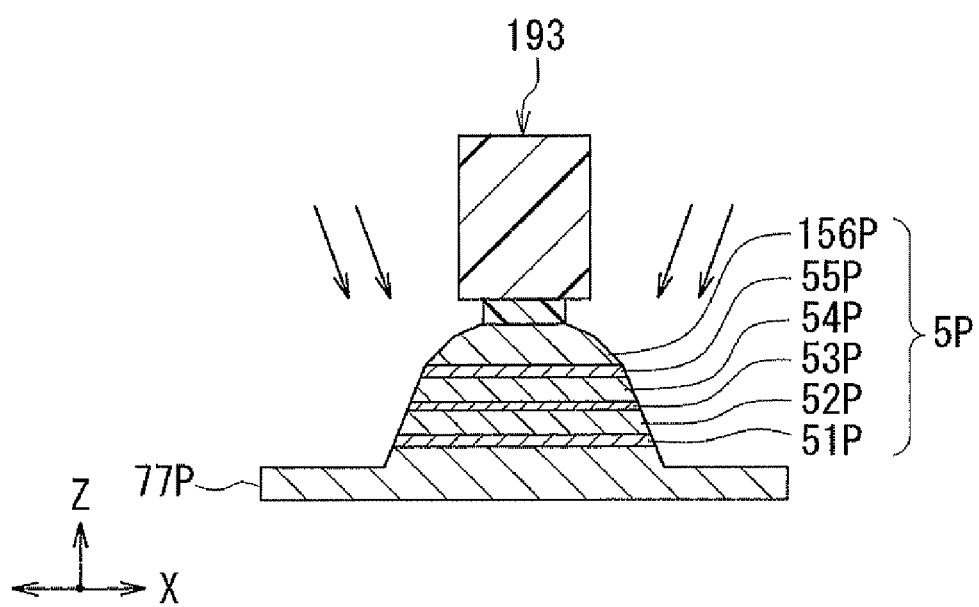
FIG. 23 is a cross-sectional view showing a step that follows the step of FIG. 22.

FIG. 23 shows the next step. In this step, the layered film 5P is etched into a predetermined shape by, for example, ion milling, using the mask 193 as the etching mask. At the same time, the magnetic layer 77P is also etched partially in the areas where the two nonmagnetic layers 90 are to be disposed later. In this step, since the mask 193 has an undercut shape, both side portions of the top surface of the magnetic film 156P in the track width direction (X direction) are etched more and becomes lower in level than the center portion of the top surface of the magnetic film 156P. After the etching, the top surface of the magnetic film 156P therefore has a convex shape as shown in FIG. 23.

Figure 24:
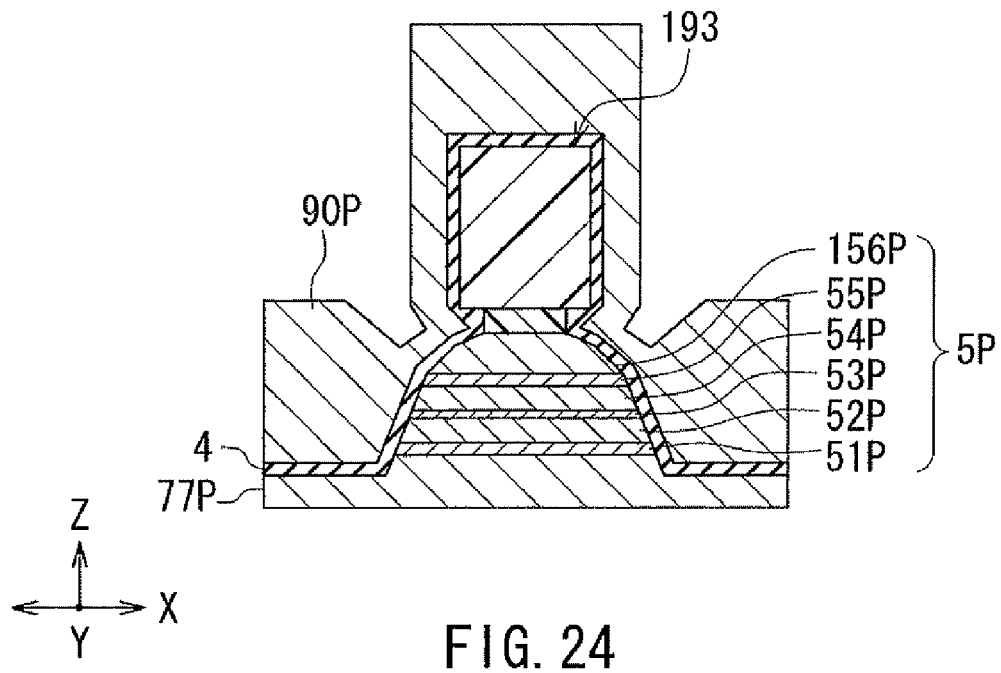
FIG. 24 is a cross-sectional view showing a step that follows the step of FIG. 23.

FIG. 24 shows the next step. Initially, the insulating film 4 and the nonmagnetic film 90P are formed in succession over the entire top surface of the stack shown in FIG. 23 by, for example, sputtering, with the mask 193 left intact. As shown in FIG. 24, the insulating film 4 and the nonmagnetic film 90P both adhere to the surface of the mask 193 in part. The nonmagnetic film 90P has a smaller thickness in the vicinity of the layered film 5P because of the shading by the mask 193 as well as the insulating film 4 and the nonmagnetic film 90P adhering to the surface of the mask 193. Next, the mask 193 is removed.

Figure 25:
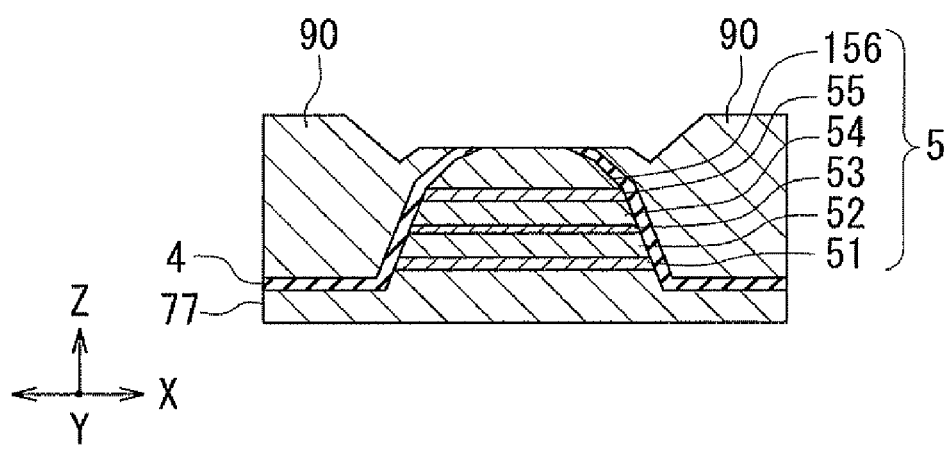
FIG. 25 is a cross-sectional view showing a step that follows the step of FIG. 24.

Next, the insulating refill layer 7, the bias magnetic field applying layer 6, and the protection layer 61 are formed as in the method of manufacturing the MR element according to the present embodiment. Consequently, the MR stack 5 and the two nonmagnetic layers 90 are formed as shown in FIG. 25. Since the magnetic film 156P has a convex top surface as described above (see FIG. 23), the magnetic cap layer 156 also has a convex top surface as shown in FIG. 25. The top surface of the magnetic cap layer 156 and the adjoining portions of the top surfaces of the insulating film 4 and the nonmagnetic layers 90 also form a convex surface in combination.

Figure 26:
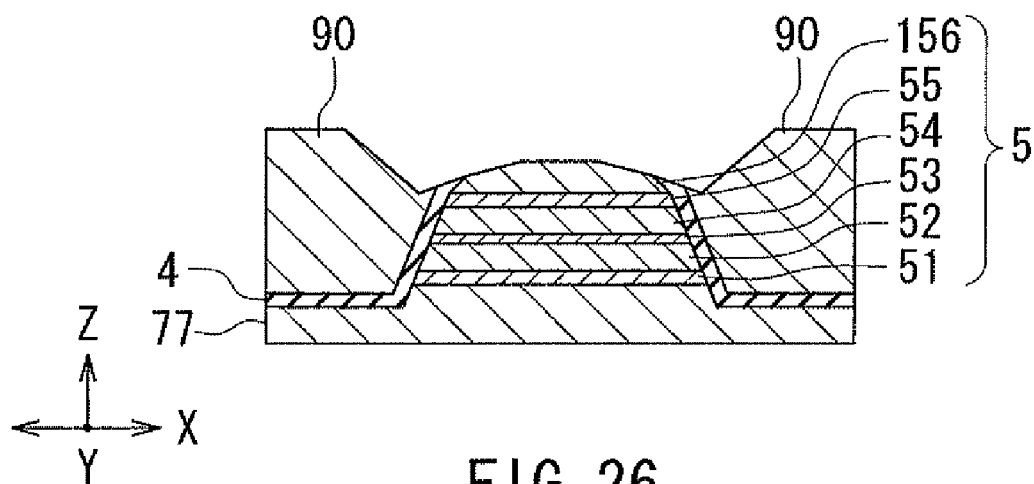
FIG. 26 is a cross-sectional view showing a step that follows the step of FIG. 25.

FIG. 26 shows the next step. In this step, the top surface of the magnetic cap layer 156 is initially cleaned by etching. Specifically, the top surface of the magnetic cap layer 156 is etched by reverse sputtering or ion milling, for example. Here, the portions of the top surfaces of the insulating film 4 and the nonmagnetic layers 90 adjoining the top surface of the magnetic cap layer 156 are also etched. As mentioned previously, the top surface of the magnetic cap layer 156 and the adjoining portions of the top surfaces of the insulating film 4 and the nonmagnetic layers 90 form a convex surface in combination even before cleaning. In the cleaning, the magnetic cap layer 156 is thus etched also from the lateral sides of the MR stack 5. Consequently, the top surface of the magnetic cap layer 156 becomes more convex.

Figure 27:
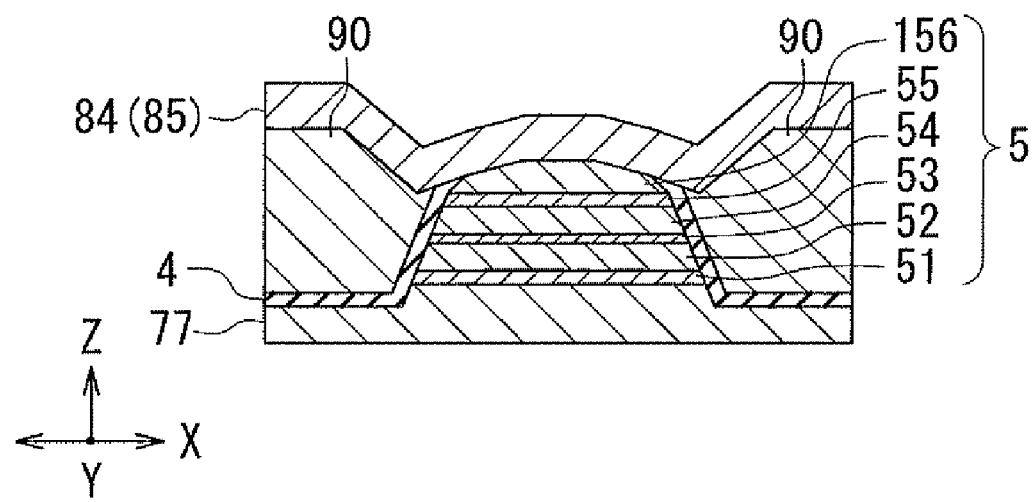
FIG. 27 is a cross-sectional view showing a step that follows the step of FIG. 26.

FIG. 27 shows the next step. In this step, the ferromagnetic layer 85 is formed over the MR stack 5, the protection layer 61 and the nonmagnetic layers 90 by, for example, sputtering, so as to be in contact with the top surface of the magnetic cap layer 156. The subsequent steps are the same as those of the present embodiment.

According to the method of manufacturing an MR element of the comparative example, as described above, the top surface of the magnetic film 156P is formed into a convex shape due to the undercut shape of the mask 193 while the layered film 5P is etched by using the mask 193. Consequently, the top surface of the magnetic cap layer 156 is also formed into a convex shape. When the mask 193 is removed and the top surface of the magnetic cap layer 156 is cleaned, the top surface of the magnetic cap layer 156 becomes more convex.

In the comparative example, the top surface of the magnetic cap layer 156 is formed into a convex shape. This means that the thickness of the magnetic cap layer 156 varies according to the position within the area surrounded by the outer edges of the MR stack 5 when the MR stack 5 is seen from above. If the magnetic cap layer 156 has such uneven thickness in the foregoing area, the stack consisting of the magnetic cap layer 156 and the ferromagnetic layer 85 disposed thereon (the magnetic stack) also has uneven thickness in that area. In the comparative example, the exchange coupling magnetic field that causes magnetic coupling between the second free layer 54 and the second exchange coupling shield layer 84 (ferromagnetic layer 85) therefore becomes uneven in that area. This consequently makes the magnetic stack unstable both in its shielding capability and its capability of controlling the direction of magnetization of the second free layer 54.

In the present embodiment, in contrast, the top surface of the magnetic film 56P is protected by the protection layer 91 while the layered film 5P is etched by using the mask 93 as the etching mask. Subsequently, the protection layer 91 is removed at least by wet etching to uncover the flat top surface of the magnetic cap layer 56. According to the present embodiment, it is thus possible to make the top surface of the magnetic cap layer 56 flat. Note that if the protection layer 91 is removed not by wet etching but by dry etching, the top surface of the magnetic cap layer 56 will be damaged by the dry etching. The present embodiment employs wet etching, so that it is possible to remove only the protection layer 91 with the magnetic cap layer 56 hardly etched or not etched at all. Consequently, according to the present embodiment, it is possible to provide the magnetic cap layer 56 with a flat top surface.

In the present embodiment, the top surface of the magnetic cap layer 56 is lower in level than its surroundings after the removal of the protection layer 91. This prevents both side portions of the top surface of the magnetic cap layer 56 in the track width direction from being etched more and thereby becoming lower in level than the center portion during the cleaning of the top surface of the magnetic cap layer 56. The top surface of the magnetic cap layer 56 can thus maintain flatness even after the cleaning.

As a result of the foregoing, according to the present embodiment, it is possible to make the magnetic cap layer 56 uniform in thickness within the area surrounded by the outer edges of the MR stack 5 when the MR stack 5 is seen from above. Consequently, according to the present embodiment, the stack consisting of the magnetic cap layer 56 and the ferromagnetic layer 85 disposed thereon (the magnetic stack) can also be made uniform in thickness in that area. The present embodiment thus allows the exchange coupling magnetic field that causes magnetic coupling between the second free layer 54 and the second exchange coupling shield layer 84 (ferromagnetic layer 85) to be uniform in the foregoing area. This allows the foregoing magnetic stack to be stable both in its shielding capability and its capability of controlling the direction of magnetization of the second free layer 54.

According to the present embodiment, since the magnetic cap layer 56 can be formed into a uniform thickness, it is possible to reduce characteristic variations among a plurality of MR elements. Now, a description will be given of the result of an experiment that was conducted to investigate characteristic variations among a plurality of MR elements. In the experiment, variations in resolution were evaluated on a plurality of MR elements manufactured by the method of manufacturing the MR element according to the present embodiment and a plurality of MR elements manufactured by the method of manufacturing an MR element of the comparative example. Resolution is a parameter that indicates the frequency dependence of read output. In the experiment, the resolution was defined as the value of the read output when writing was performed with a high-frequency signal, divided by the read output when writing was performed with a signal of isolated waveform. The resolution value depends on the shielding capability. Variations in resolution serve as an indicator of variations in the shielding capability among a plurality of MR elements.

In the experiment, in fabricating a plurality of MR elements by the method of manufacturing the MR element according to the present embodiment, a protection layer 91 composed of a 3-nm-thick alumina protection layer body 91A and a 1-nm-thick Ta adhesion film 91B was formed on the layered film 5P having the configuration shown in Table 1. When cleaning the top surface of the magnetic cap layer 56, the NiFe layer of the magnetic cap layer 56 was etched by 3 nm. Hereinafter, the plurality of MR elements fabricated by the method of manufacturing the MR element according to the present embodiment will be referred to as samples of the practical example.

In the experiment, a plurality of MR elements were also fabricated by the method of manufacturing an MR element of the comparative example. The NiFe layer of the magnetic film 156P was formed with an initial thickness of 9 nm. When cleaning the top surface of the magnetic cap layer 156, the NiFe layer of the magnetic cap layer 156 was etched by 7 nm. Hereinafter, the plurality of MR elements fabricated by the method of manufacturing an MR element of the comparative example will be referred to as samples of the comparative example.

In the experiment, the samples of the practical example and those of the comparative example were each evaluated in terms of the resolution. For evaluation, the read output obtained by writing and reading a signal of 200-MHz frequency was divided by the read output obtained by writing and reading a signal of isolated waveform to determine the resolution. Here, a voltage of 150 mV was applied to the MR stacks 5 of the samples of the practical example and those of the comparative example. As a result, the samples of the practical example showed an average resolution of 48%, and the samples of the comparative example showed an average resolution of 50%. The resolutions of the samples of the practical example had a standard deviation of 2.2%, and those of the samples of the comparative example had a standard deviation of 4.4%. It is shown from the result that the samples of the practical example are capable of reducing variations in resolution as compared with the samples of the comparative example while maintaining resolution equivalent to that of the samples of the comparative example. As can be seen from the result, it is possible according to the present embodiment to reduce characteristic variations among a plurality of MR elements.

The foregoing result of the experiment can be quantitatively explained as follows. In the samples of the comparative example, the magnetic cap layer 156 has uneven thickness as described above. This makes the stack consisting of the magnetic cap layer 156 and the ferromagnetic layer 85 (the magnetic stack) unstable both in its shielding capability and its capability of controlling the direction of magnetization of the second free layer 54. As a result, characteristic variations among the plurality of MR elements increase.

In contrast, in the samples of the practical example, the magnetic cap layer 56 has uniform thickness. This allows the stack consisting of the magnetic cap layer 56 and the ferromagnetic layer 85 (the magnetic stack) to be stable both in its shielding capability and its capability of controlling the direction of magnetization of the second free layer 54. As a result, characteristic variations among the plurality of MR elements decrease.

MODIFICATION EXAMPLE

Figure 28:
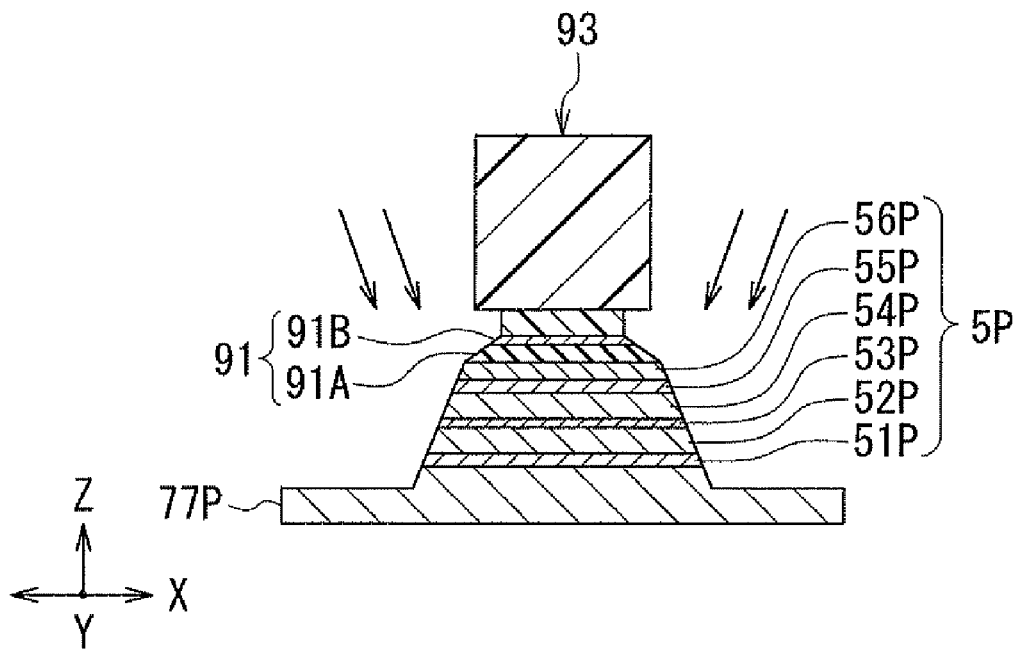
FIG. 28 is a cross-sectional view showing a step of a modification example of the method of manufacturing a magnetoresistive element according to the embodiment of the invention.
Figure 29:
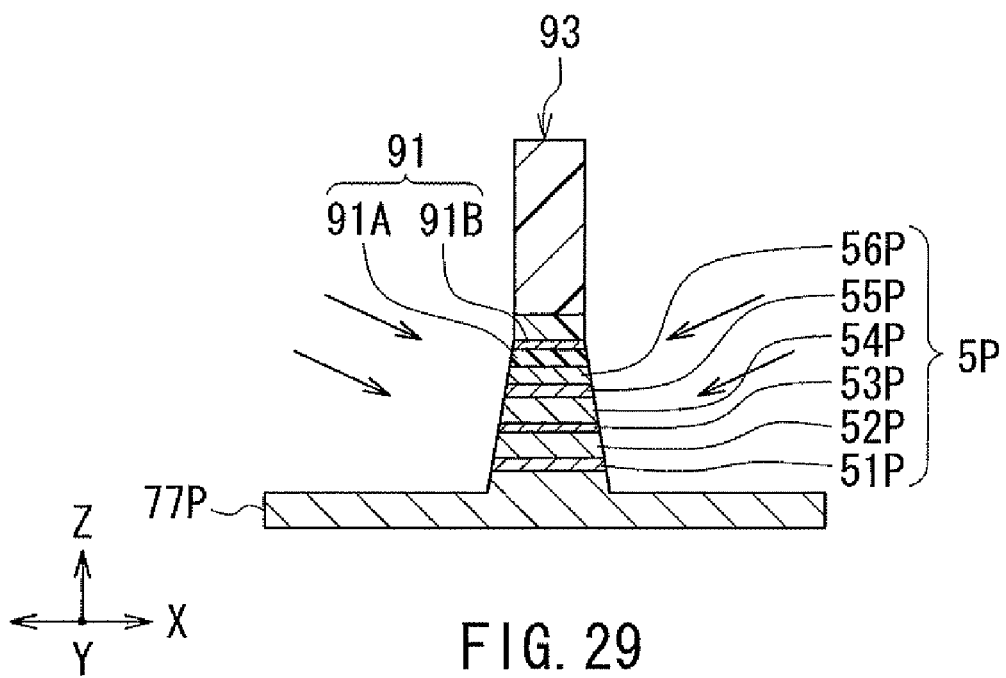
FIG. 29 is a cross-sectional view showing a step that follows the step of FIG. 28.

A modification example of the method of manufacturing the MR element according to the present embodiment will now be described with reference to FIG. 28 and FIG. 29. FIG. 28 and FIG. 29 each show a cross section of a stack of layers in the process of manufacturing the MR element, the cross section being perpendicular to the medium facing surface 40 and the top surface of the substrate 1. The portions lying below the magnetic layer 77P are omitted in FIG. 28 and FIG. 29. The steps of this modification example are the same as those of the method of manufacturing the MR element shown in FIG. 13 to FIG. 16 up to the step of forming the mask 93.

FIG. 28 and FIG. 29 show the step after the formation of the mask 93. In this step, the layered film 5P and the protection layer 91 are etched into a predetermined shape by ion milling using ion beams in more than one direction of travel. This step will be described in detail below.

In this step, like the step shown in FIG. 17, the layered film 5P and the protection layer 91 are initially etched into a predetermined shape as shown in FIG. 28 by, for example, ion milling, using the mask 93 as the etching mask. At the same time, the magnetic layer 77P is etched partially in the areas where the two nonmagnetic layers 90 are to be disposed later. The arrows in FIG. 28 show the ion beams.

Next, as shown in FIG. 29, both side surfaces of the layered film 5P in the track width direction (X direction) are etched by ion milling. The arrows in FIG. 29 show the ion beams. During this etching, the angle that the directions of travel of the ion beams form with respect to the stacking direction of the plurality of films constituting the layered film 5P (the direction perpendicular to the top surface of the substrate 1) is made greater than that the directions of travel of the ion beams form with respect to the stacking direction in the step shown in FIG. 28. In this step, the layered film 5P is etched so that the dimension of the layered film 5P in the track width direction becomes smaller than after the etching shown in FIG. 28. The subsequent steps are the same as in the method of manufacturing the MR element shown in FIG. 18 to FIG. 21.

According to the modification example, it is possible to make the dimension of the MR stack 5 in the track width direction even smaller. In the modification example, if the protection layer body 91A of the protection layer 91 is made of alumina, it is possible to make the etching rate of the protection layer 91 lower than the etching rate of the plurality of films constituting the layered film 5P when etching the layered film 5P by ion milling. This makes it possible that, in the step shown in FIG. 29, both side surfaces of the layered film 5P in the track width direction each form a smaller angle with respect to the stacking direction. Consequently, it is possible that both side surfaces of the MR stack 5 in the track width direction each form a smaller angle with respect to the stacking direction. It is thus possible to make the widths of the free layers 52 and 54 smaller even with the top surface of the MR stack 5 unchanged in width. As a result, it is possible to make the track width of the MR element smaller.

The present invention is not limited to the foregoing embodiment, and various modifications may be made thereto. For example, while the foregoing embodiment has illustrated an example where the spacer layer is a tunnel barrier layer, the spacer layer of the present invention may be a nonmagnetic conductive layer, or may be a spacer layer of current-confined-path type which includes a portion allowing the passage of currents and a portion intercepting the passage of currents.

While the foregoing embodiment has been described with reference to a thin-film magnetic head having a structure in which the read head is formed on the base body and the write head is stacked on the read head, the read head and the write head may be stacked in the reverse order. If the thin-film magnetic head is to be used only for read operations, the thin-film magnetic head may be configured to include the read head only.

The present invention is applicable not only to MR elements intended for use as the read head of a thin-film magnetic head, but also to MR elements intended for various purposes in general.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. A method of manufacturing a magnetoresistive element, the magnetoresistive element comprising:
   a first and a second main shield layers; and
   a first and a second antiferromagnetic layers, a first and a second exchange coupling shield layers, an MR stack, and a nonmagnetic layer that are disposed between the first and second main shield layers, wherein:
   the first main shield layer, the first antiferromagnetic layer, the first exchange coupling shield layer, the MR stack, the second exchange coupling shield layer, the second antiferromagnetic layer, and the second main shield layer are stacked in this order;
   the nonmagnetic layer is disposed around the MR stack, between the first and second exchange coupling shield layers;
   the MR stack includes: a spacer layer made of a nonmagnetic material; a first free layer disposed between the first exchange coupling shield layer and the spacer layer; a second free layer disposed between the second exchange coupling shield layer and the spacer layer; and a magnetic cap layer made of a magnetic material and disposed between the second free layer and the second exchange coupling shield layer;
   the first exchange coupling shield layer is exchange-coupled to the first antiferromagnetic layer;
   the second exchange coupling shield layer is exchange-coupled to the second antiferromagnetic layer;
   the first free layer is magnetically coupled to the first exchange coupling shield layer and thereby has a controlled direction of magnetization;
   the magnetic cap layer is in contact with the second exchange coupling shield layer and is magnetically coupled to the second exchange coupling shield layer; and
   the second free layer is magnetically coupled to the second exchange coupling shield layer via the magnetic cap layer and thereby has a controlled direction of magnetization,
   the method comprising the steps of:
   forming the first main shield layer;
   forming the first antiferromagnetic layer after the formation of the first main shield layer;
   forming the first exchange coupling shield layer after the formation of the first antiferromagnetic layer;
   forming the MR stack and the nonmagnetic layer after the formation of the first exchange coupling shield layer;
   forming the second exchange coupling shield layer after the formation of the MR stack and the nonmagnetic layer; and
   forming the second main shield layer after the formation of the second exchange coupling shield layer,
   wherein the step of forming the MR stack and the nonmagnetic layer includes the steps of
   forming a layered film that is to be patterned into the MR stack later;
   forming a protection layer on a top surface of the layered film, the protection layer including a protection layer body that is in contact with the top surface of the layered film and dissolves during wet etching to be performed later;
   forming a mask on the protection layer, the mask being intended for use for patterning the layered film;
   etching the layered film and the protection layer by using the mask;
   forming the nonmagnetic layer with the mask left intact;
   removing the mask; and
   removing the protection layer at least by wet etching so that the magnetic cap layer is exposed.

2. The method of manufacturing the magnetoresistive element according to claim 1, wherein the mask has an undercut shape.

3. The method of manufacturing the magnetoresistive element according to claim 1, wherein the step of forming the MR stack and the nonmagnetic layer further includes the step of cleaning a top surface of the magnetic cap layer by etching after the step of removing the protection layer.

4. The method of manufacturing the magnetoresistive element according to claim 1, wherein:
   the protection layer body is made of alumina; and
   the step of removing the protection layer uses an alkaline etching solution in the wet etching.

5. The method of manufacturing the magnetoresistive element according to claim 1, wherein:
   the protection layer further includes an adhesion film formed on the protection layer body; and
   the mask is formed on the adhesion film.

6. The method of manufacturing the magnetoresistive element according to claim 5, wherein the adhesion film is made of Ta.

7. The method of manufacturing the magnetoresistive element according to claim 1, wherein the step of etching the layered film and the protection layer employs ion milling using ion beams in more than one direction of travel.

8. The method of manufacturing the magnetoresistive element according to claim 1, wherein:
   one of the first exchange coupling shield layer and the second exchange coupling shield layer includes a nonmagnetic middle layer that is made of a nonmagnetic conductive material, and two ferromagnetic layers that are antiferromagnetically exchange-coupled to each other via the nonmagnetic middle layer; and
   the other of the first exchange coupling shield layer and the second exchange coupling shield layer includes one or more ferromagnetic layers and no nonmagnetic middle layer.

* * * * *